(12) United States Patent
Medendorp, Jr. et al.

(10) Patent No.: US 8,125,137 B2
(45) Date of Patent: *Feb. 28, 2012

(54) MULTI-CHIP LIGHT EMITTING DEVICE LAMPS FOR PROVIDING HIGH-CRI WARM WHITE LIGHT AND LIGHT FIXTURES INCLUDING THE SAME

(75) Inventors: Nicholas W. Medendorp, Jr., Raleigh, NC (US); Mark McClear, Cary, NC (US); Bernd P. Keller, Santa Barbara, CA (US); George R. Brandes, Raleigh, NC (US); Ronan P. LeToquin, Durham, NC (US)

(73) Assignee: Cree, Inc., Durham, NC (US)

( * ) Notice: Subject to any disclaimer, the term of this patent is extended or adjusted under 35 U.S.C. 154(b) by 589 days.

This patent is subject to a terminal disclaimer.

(21) Appl. No.: 11/743,324

(22) Filed: May 2, 2007

(65) Prior Publication Data

US 2007/0223219 A1  Sep. 27, 2007

Related U.S. Application Data

(63) Continuation-in-part of application No. 11/032,363, filed on Jan. 10, 2005, now Pat. No. 7,564,180.

(51) Int. Cl.
*H01L 33/00* (2010.01)
*H01J 1/62* (2006.01)

(52) U.S. Cl. ........................ 313/501; 313/502

(58) Field of Classification Search .......... 313/501–503; 257/89; 362/800
See application file for complete search history.

(56) References Cited

U.S. PATENT DOCUMENTS 3,805,937 A  4/1974  Hatanaka et al.
3,875,456 A  4/1975  Kano et al.
(Continued)

FOREIGN PATENT DOCUMENTS

DE  3916875 A  12/1990
(Continued)

OTHER PUBLICATIONS

Compound Semiconductors Online, "LED Lighting Fixtures Inc. Sets World Record at 80 Lumens per Watt for Warm White Fixture", "Compound Semiconductors Online", May 30, 2006, p. 1.
(Continued)

*Primary Examiner* — Karabi Guharay
(74) *Attorney, Agent, or Firm* — Vincent K. Gustafson; Jenkins, Wilson, Taylor & Hunt

(57) ABSTRACT

A multi-chip lighting emitting device (LED) lamp for providing white light includes a submount including first and second die mounting regions thereon. A first LED chip is mounted on the first die mounting region, and a second LED chip is mounted on the second die mounting region. The LED lamp is configured to emit light having a spectral distribution including at least four different color peaks to provide the white light. For example, a first conversion material may at least partially cover the first LED chip, and may be configured to absorb at least some of the light of the first color and re-emit light of a third color. In addition, a second conversion material may at least partially cover the first and/or second LED chips, and may be configured to absorb at least some of the light of the first and/or second colors and re-emit light of a fourth color. Related light fixtures and methods are also discussed.

37 Claims, 7 Drawing Sheets

U.S. PATENT DOCUMENTS

| | | | |
|---|---|---|---|
| 3,927,290 A | 12/1975 | Denley | |
| 4,120,026 A | 10/1978 | Tsuchihashi et al. | |
| 4,325,146 A | 4/1982 | Lennington | |
| 4,408,157 A | 10/1983 | Beaubien | |
| 4,420,398 A | 12/1983 | Castino | |
| 4,710,699 A | 12/1987 | Miyamoto | |
| 5,087,883 A | 2/1992 | Hoffman | |
| 5,264,997 A | 11/1993 | Hutchinsson et al. | |
| 5,407,799 A | 4/1995 | Studier | |
| 5,410,519 A | 4/1995 | Hall et al. | |
| 5,477,436 A | 12/1995 | Betling et al. | |
| 5,563,849 A | 10/1996 | Hall et al. | |
| 5,803,579 A | 9/1998 | Turnbull et al. | |
| 5,851,063 A | 12/1998 | Doughty et al. | |
| 5,959,316 A | 9/1999 | Lowery | |
| 6,066,861 A | 5/2000 | Hohn et al. | |
| 6,076,936 A | 6/2000 | George | |
| 6,084,250 A | 7/2000 | Justel et al. | |
| 6,095,666 A | 8/2000 | Salam | |
| 6,132,072 A | 10/2000 | Turnbull et al. | |
| 6,150,774 A | 11/2000 | Mueller et al. | |
| 6,212,213 B1 | 4/2001 | Weber et al. | |
| 6,234,648 B1 | 5/2001 | Borner et al. | |
| 6,252,254 B1 | 6/2001 | Soules et al. | |
| 6,255,670 B1 | 7/2001 | Srivastava et al. | |
| 6,278,135 B1 | 8/2001 | Srivastava et al. | |
| 6,292,901 B1 | 9/2001 | Lys et al. | |
| 6,294,800 B1 | 9/2001 | Duggal et al. | |
| 6,319,425 B1 | 11/2001 | Tasaki et al. | |
| 6,335,538 B1 | 1/2002 | Prutchi et al. | |
| 6,337,536 B1 | 1/2002 | Matsubara et al. | |
| 6,348,766 B1 | 2/2002 | Ohishi et al. | |
| 6,350,041 B1 | 2/2002 | Tarsa et al. | |
| 6,357,889 B1 | 3/2002 | Duggal et al. | |
| 6,394,621 B1 | 5/2002 | Hanewinkel | |
| 6,429,583 B1 | 8/2002 | Levinson et al. | |
| 6,441,558 B1 | 8/2002 | Muthu et al. | |
| 6,480,299 B1 | 11/2002 | Drakopoulos et al. | |
| 6,501,100 B1 | 12/2002 | Srivastava et al. | |
| 6,504,179 B1 | 1/2003 | Ellens et al. | |
| 6,513,949 B1 | 2/2003 | Marshall et al. | |
| 6,522,065 B1 | 2/2003 | Srivastava et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,577,073 B2 | 6/2003 | Shimizu et al. | |
| 6,578,986 B2 | 6/2003 | Swaris et al. | |
| 6,592,810 B2 | 7/2003 | Nishida et al. | |
| 6,600,175 B1 | 7/2003 | Baretz et al. | |
| 6,600,324 B2 | 7/2003 | St-Germain | |
| 6,603,258 B1 | 8/2003 | Meuller-Mach et al. | |
| 6,608,485 B2 | 8/2003 | St-Germain | |
| 6,616,862 B2 | 9/2003 | Srivastava et al. | |
| 6,624,350 B2 | 9/2003 | Nixon et al. | |
| 6,636,003 B2 | 10/2003 | Rahm et al. | |
| 6,642,666 B1 | 11/2003 | St-Germain | |
| 6,683,423 B2 | 1/2004 | Cunningham | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,703,173 B2 | 3/2004 | Lu et al. | |
| 6,712,486 B1 | 3/2004 | Popovich et al. | |
| 6,737,801 B2 | 5/2004 | Ragle | |
| 6,744,194 B2 | 6/2004 | Fukasawa et al. | |
| 6,762,563 B2 | 7/2004 | St-Germain | |
| 6,784,463 B2 | 8/2004 | Camras et al. | |
| 6,791,257 B1 | 9/2004 | Sato et al. | |
| 6,817,735 B2 | 11/2004 | Shimizu et al. | |
| 6,841,804 B1 | 1/2005 | Chen et al. | |
| 6,851,834 B2 | 2/2005 | Leysath | |
| 6,880,954 B2 | 4/2005 | Ollett et al. | |
| 6,882,101 B2 | 4/2005 | Ragle | |
| 6,890,085 B2 | 5/2005 | Hacker | |
| 6,914,267 B2 | 7/2005 | Fukasawa et al. | |
| 6,936,857 B2 | 8/2005 | Doxsee et al. | |
| 6,967,116 B2 | 11/2005 | Negley | |
| 7,005,679 B2 | 2/2006 | Tarsa et al. | |
| 7,008,078 B2 | 3/2006 | Shimizu et al. | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,061,454 B2 | 6/2006 | Sasuga et al. | |
| 7,066,623 B2 | 6/2006 | Lee et al. | |
| 7,083,302 B2 | 8/2006 | Chen et al. | |
| 7,093,958 B2 | 8/2006 | Coushaine | |
| 7,095,056 B2 | 8/2006 | Vitta et al. | |
| 7,102,172 B2 | 9/2006 | Lynch et al. | |
| 7,135,664 B2 | 11/2006 | Vornsand et al. | |
| 7,164,231 B2 | 1/2007 | Choi et al. | |
| 7,207,691 B2 | 4/2007 | Lee et al. | |
| 7,213,940 B1 | 5/2007 | Van De Ven et al. | |
| 7,215,074 B2 | 5/2007 | Shimizu et al. | |
| 7,232,212 B2 | 6/2007 | Iwase | |
| 7,239,085 B2 | 7/2007 | Kawamura | |
| 7,250,715 B2 | 7/2007 | Meuller et al. | |
| 7,255,457 B2 | 8/2007 | Ducharme et al. | |
| 7,256,557 B2 | 8/2007 | Lim et al. | |
| 7,329,024 B2 | 2/2008 | Lynch et al. | |
| 7,358,954 B2 | 4/2008 | Negley | |
| 7,365,485 B2 | 4/2008 | Fukasawa et al. | |
| 7,387,405 B2 | 6/2008 | Ducharme et al. | |
| 7,422,504 B2 | 9/2008 | Maeda et al. | |
| 7,453,195 B2 | 11/2008 | Radkov | |
| 7,473,934 B2 | 1/2009 | Nagai et al. | |
| 7,474,044 B2 | 1/2009 | Ge | |
| 7,564,180 B2 | 7/2009 | Brandes | |
| 7,740,365 B2 | 6/2010 | Huttner et al. | |
| 2001/0002049 A1 | 5/2001 | Reeh et al. | |
| 2002/0070681 A1 | 6/2002 | Shimizu et al. | |
| 2002/0087532 A1 | 7/2002 | Barritz et al. | |
| 2003/0026096 A1 | 2/2003 | Ellens et al. | |
| 2003/0030063 A1 | 2/2003 | Sosniak et al. | |
| 2003/0067773 A1 | 4/2003 | Marshall et al. | |
| 2003/0146411 A1 | 8/2003 | Srivastava et al. | |
| 2003/0222268 A1 | 12/2003 | Yocom et al. | |
| 2004/0027481 A1 | 2/2004 | Asai et al. | |
| 2004/0046178 A1 | 3/2004 | Sano | |
| 2004/0105264 A1 | 6/2004 | Spero | |
| 2004/0212998 A1 | 10/2004 | Mohacsi | |
| 2004/0218387 A1 | 11/2004 | Gerlach | |
| 2004/0252962 A1 | 12/2004 | Ryan | |
| 2004/0264193 A1 | 12/2004 | Okumura | |
| 2005/0052378 A1 | 3/2005 | Hacker | |
| 2005/0231948 A1 | 10/2005 | Pohlert et al. | |
| 2005/0243556 A1 | 11/2005 | Lynch | |
| 2005/0251698 A1 | 11/2005 | Lynch et al. | |
| 2005/0259423 A1 | 11/2005 | Heuser et al. | |
| 2005/0274972 A1 | 12/2005 | Roth et al. | |
| 2006/0012989 A1 | 1/2006 | Lee | |
| 2006/0022582 A1 | 2/2006 | Radkov | |
| 2006/0060872 A1 | 3/2006 | Edmond et al. | |
| 2006/0067073 A1 | 3/2006 | Ting | |
| 2006/0105482 A1 | 5/2006 | Alferink et al. | |
| 2006/0113548 A1 | 6/2006 | Chen et al. | |
| 2006/0120073 A1 | 6/2006 | Pickard et al. | |
| 2006/0138435 A1 | 6/2006 | Tarsa et al. | |
| 2006/0138937 A1 | 6/2006 | Ibbetson | |
| 2006/0149607 A1 | 7/2006 | Sayers et al. | |
| 2006/0152140 A1 | 7/2006 | Brandes | |
| 2006/0180818 A1 | 8/2006 | Nagai et al. | |
| 2006/0181192 A1 | 8/2006 | Radkov | |
| 2006/0245184 A1 | 11/2006 | Galli | |
| 2007/0001188 A1 | 1/2007 | Lee | |
| 2007/0041220 A1 | 2/2007 | Lynch | |
| 2007/0051966 A1 | 3/2007 | Higashi et al. | |
| 2007/0090381 A1 | 4/2007 | Otsuka et al. | |
| 2007/0137074 A1 | 6/2007 | Van De Ven et al. | |
| 2007/0138932 A1* | 6/2007 | Morioka et al. | 313/485 |
| 2007/0139920 A1 | 6/2007 | Van De Ven et al. | |
| 2007/0139923 A1 | 6/2007 | Negley et al. | |
| 2007/0170447 A1 | 7/2007 | Negley | |
| 2007/0171145 A1 | 7/2007 | Coleman et al. | |
| 2007/0202623 A1 | 8/2007 | Gao et al. | |
| 2007/0236911 A1 | 10/2007 | Negley | |
| 2007/0247414 A1 | 10/2007 | Roberts | |
| 2007/0247847 A1 | 10/2007 | Villard | |
| 2007/0262337 A1 | 11/2007 | Villard | |

| | | | |
|---|---|---|---|
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley et al. |
| 2008/0084685 A1 | 4/2008 | Van De Ven |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Van De Ven et al. |
| 2008/0137347 A1 | 6/2008 | Trott et al. |
| 2008/0170396 A1 | 7/2008 | Yuan et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0211416 A1 | 9/2008 | Negley et al. |
| 2008/0218992 A1 | 9/2008 | Li |
| 2008/0231201 A1 | 9/2008 | Higley et al. |
| 2008/0259589 A1 | 10/2008 | Van de Ven et al. |
| 2008/0278928 A1 | 11/2008 | Van De Ven et al. |
| 2008/0278940 A1 | 11/2008 | Van de Ven et al. |
| 2008/0278950 A1 | 11/2008 | Pickard et al. |
| 2008/0278952 A1 | 11/2008 | Trott et al. |
| 2008/0304260 A1 | 12/2008 | Van de Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp, Jr. et al. |
| 2009/0108269 A1 | 4/2009 | Negley et al. |
| 2009/0195137 A1 | 8/2009 | Brandes |
| 2010/0140634 A1 | 6/2010 | Van de Ven et al. |
| 2011/0050125 A1 | 3/2011 | Medendorp |

FOREIGN PATENT DOCUMENTS

| | | | |
|---|---|---|---|
| DE | 10335077 A1 | | 3/2005 |
| EP | 0838866 A2 | | 4/1998 |
| EP | 0971421 A2 | | 1/2000 |
| EP | 1024399 A1 | | 8/2000 |
| EP | 1081771 A2 | | 7/2001 |
| EP | 1160883 A2 | | 12/2001 |
| EP | 1193772 A2 | | 3/2002 |
| EP | 1367655 A1 | | 12/2003 |
| EP | 1462711 A1 | | 12/2004 |
| EP | 1526057 A2 | | 4/2005 |
| EP | 1566848 A2 | | 8/2005 |
| EP | 1571715 A | | 9/2005 |
| EP | 1760795 A2 | | 1/2006 |
| GB | 2361354 A | * | 10/2001 |
| JP | 10-163535 A | | 6/1998 |
| JP | 2000-022222 A | | 1/2000 |
| JP | 2000-183408 A1 | | 6/2000 |
| JP | 2001-111114 A1 | | 4/2001 |
| JP | 2001-1156331 A | | 6/2001 |
| JP | 2001-307506 A | | 11/2001 |
| JP | 2002-150821 A1 | | 5/2002 |
| JP | 2004-080046 A | | 3/2004 |
| JP | 2004103443 A | | 4/2004 |
| JP | 2004-253309 A | | 9/2004 |
| JP | 2004-356116 A | | 12/2004 |
| JP | 2004-363055 A | | 12/2004 |
| JP | 2005-005482 A | | 1/2005 |
| JP | 2005-101296 A | | 4/2005 |
| JP | 2005-142311 A | | 6/2005 |
| JP | 2006-040872 A | | 2/2006 |
| JP | 2006-261702 A | | 9/2006 |
| JP | 2007-080880 A | | 3/2007 |
| JP | 2007-122950 A | | 5/2007 |
| JP | 2007-141737 A1 | | 7/2007 |
| TW | 546854 A | | 8/2003 |
| TW | I228837 A | | 3/2005 |
| WO | 9843014 A1 | | 10/1998 |
| WO | 0034709 A1 | | 6/2000 |
| WO | 0169692 A1 | | 9/2001 |
| WO | 04002198 A1 | | 12/2003 |
| WO | 2004068909 A1 | | 8/2004 |
| WO | 2004100611 A1 | | 11/2004 |
| WO | 2005004202 A2 | | 1/2005 |
| WO | 2005013365 A2 | | 10/2005 |
| WO | 2005124877 A2 | | 12/2005 |
| WO | 2006028312 A1 | | 3/2006 |
| WO | 2007025538 A2 | | 3/2007 |
| WO | 2007061758 A1 | | 5/2007 |

OTHER PUBLICATIONS

Cree Inc., "Cree XLamp 7090 XR-E Series LED: Binning and Labeling", "Cree Inc. Advertisment", 2005, pp. 1-7, Publisher: Cree Inc.

CSA International, "Test Data Report No. 1786317-1", Apr. 20, 2006, pp. 1-15, Publisher: CSA International.

U.S. Department of Energy, "Product Test Reference: CALiPer 7-31 Downlight Lamp", "DOE SSL CALiPer Report", Sep. 2007, pp. 1-21.

U.S. Department of Energy, "Product Test Reference: CALiPer 7-47 Downlight Lamp", "DOE SSL CALiPer Report", Sep. 10, 2007, pp. 1-21.

Krames, M., "Lumileds Lighting, Light from Silicon Valley", "Progress and Future Direction of LED Technology, SSL Workshop", Nov. 13, 2003, pp. 1-21, Publisher: Lumileds Lighting Inc.

LED Lighting Fixtures, "LED Lighting Fixtures Creates 750 Lumen Recessed Light and Uses Only 16 Watts of Power", "Press Release from LED Lighting Fixtures dated Jan. 26, 2006", p. 1.

LED Lighting Fixtures, "LED Lighting Fixtures Inc., achieves unprecedented gain in light output from new luminaire", "Press Release from LED Lighting Fixtures dated Apr. 24, 2006", p. 1.

LED Lighting Fixtures, "LED Lighting Fixtures, Inc., Announces Record Performance", "Press Release from LED Lighting Fixtures dated Feb. 16, 2006", p. 1.

LED Lighting Fixtures, "LED Lighting Fixtures Announces its First LED-based Recessed Down Light", "Press Release from LED Lighting Fixtures dated Feb. 7, 2007", p. 1.

LED Lighting Fixtures, "LED Lighting Fixtures Inc. Sets World Record at 80 Lumens per Watt for Warm White Fixture", "Press Release from LED Lighting Fixtures dated May 30, 2006", p. 1.

Narendran, N. et al., "Solid State Lighting: Failure Analysis of White LEDS (abstract only)", Jun. 11, 2004, pp. 1-2.

U.S. Appl. No. 12/017,676.
U.S. Appl. No. 12/0577,748.
U.S. Appl. No. 12/146,018.
U.S. Appl. No. 12/248,220.
U.S. Appl. No. 12/257,804.
U.S. Appl. No. 12/277,745.
U.S. Appl. No. 12/328,144.
U.S. Appl. No. 60/978,880.
U.S. Appl. No. 60/990,435.
U.S. Appl. No. 60/990,439.
U.S. Appl. No. 60/990,724.
U.S. Appl. No. 61/022,886.
U.S. Appl. No. 61/037,365.
U.S. Appl. No. 61/039,926.
U.S. Appl. No. 61/041,404.
U.S. Appl. No. 61/075,513.

Van De Ven, A. et al., "Warm White Illumination with High CRI and High Efficacy by Combing 455nm Excited Yellowish Phosphor LEDs and Red AlInGaP LEDs", "First International Conference on White LEDs and Solid State Lighting", Nov. 26, 2007, pp. 03-07.

Chhajed, S., "Influence of junction temperature on chromaticity and color-rendering properties of trichromatic white-light sources based on light-emitting diodes", "Journal of Applied Physics", 2005, pp. 1-8, vol. 97.

Color Kinetics Inc., "Color Quality of Intelligent Solid-State Lighting Systems", "Color Quality of Solid-State Light Source", Mar. 2005, pp. 1-3.

Color Kinetics Inc., "Color Kinetics Support : White Papers & Presentations"; available at http://www. colorkinetics.com/support/whitepapers/, "Solid State Lighting White Papers & Presentations", Feb. 22, 2006, pp. 1-3.

Narendran, N. et al., "Color Rendering Properties of LED Light Sources", 2002, pp. 1-8.

OptoLED Lighting Inc., "OptoLED Product Information", 2009, Publisher: OptoLED GmBH website; accessed at http://www.optoled.de/englisch/products/led.html.

Permlight Inc., "Enbryten LED Prodict Information", Feb. 2005, Publisher: Permlight Inc. website; accessed at http://www.webachive.org displaying that www.permlight.com/products/LEDfixtures.asp was publicly available Jan. 2004.

TW—546854—Derwent Abstract—A, Aug. 11, 2003, Chang, B., et al.

U.S. Department of Energy, "Summary of Results: Round 3 of Product Testing", "DOE SSL CALiPer Report", Oct. 2007, pp. 1-18.

U.S. Department of Energy, "Summary of Results: Round 4 of Product Testing", "DOE SSL CALiPer Report", Jan. 2008, pp. 1-22.

U.S. Department of Energy, "Summary of Results: Round 5 of Product Testing", "DOE SSL CALiPer Report", May 2008, pp. 1-30.

Duggal, A.,"Organic Electroluminescence", edited by Zakya Kafafi, Published: 2005, Chapter 10,pp. 437-466, Publisher: CRC Press.

Sandia National Laboratories, "Light Emitting Diodes (LEDs) for General Illumination: An OIDA technology Roadmap 2002", Oct. 2002, Publisher: Optoelectronics Industry Development Association (OIDA), pp. 1-111, available at http://lighting.sandia.gov/lightingdocs/OIDA_SSL_LED_Roadmap_Full.pdf.

TIR Systems Ltd.,"Lexel: brillance you can see LED Product Webpage", 2006, pp. 13, Publisher: TIR Systems Ltd., available at http://web.archive.org/web/20070106231922/http://tirsys.com/technology/index.htm.

Narukawa, Y. et al., "Ultra-High Efficiency White Light Emitting Diodes", "Japanese Journal of Applied Physics", Oct. 13, 2006, pp. L1084-L1086, vol. 45, No. 41.

Schubert, E. Fred, "Light Emitting Diodes: Chapter 2", 2006, pp. 346-366, Publisher: Cambridge University Press.

Zukausakas, A. et al., "Introduction to Solid State Lighting", 2002, pp. 118-122, Publisher: John Wiley and Sons.

"White Light LED, Part Nos. NSPW300BS and NSPW312BS, High Brightness LEDs", Nov. 12, 1999, Publisher: Nichia Corporation.

Shimizu, Yoshinori, "Development of High Efficiency LED downlight", "Proceeding of the First International Conference on White LEDs and Solid State Lighting", Nov. 26, 2007, pp. 1-5.

U.S. Appl. No. 12/566,253.

U.S. Appl. No. 12/769,354.

* cited by examiner

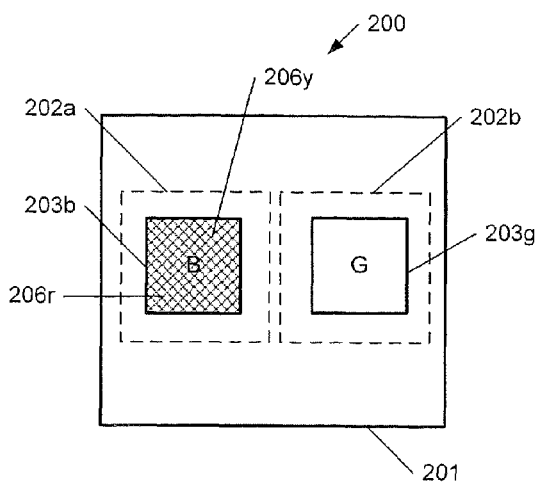
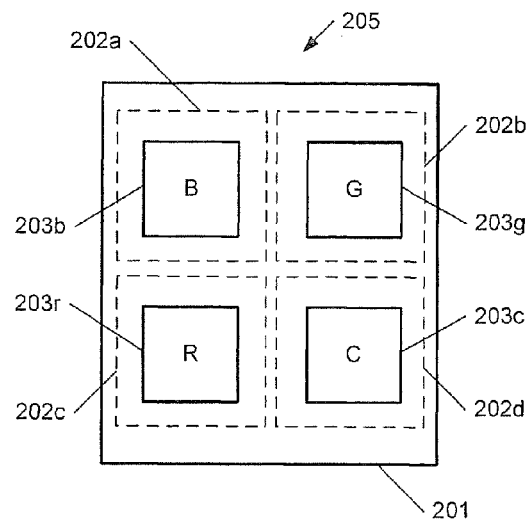
FIG. 2A          FIG. 2B
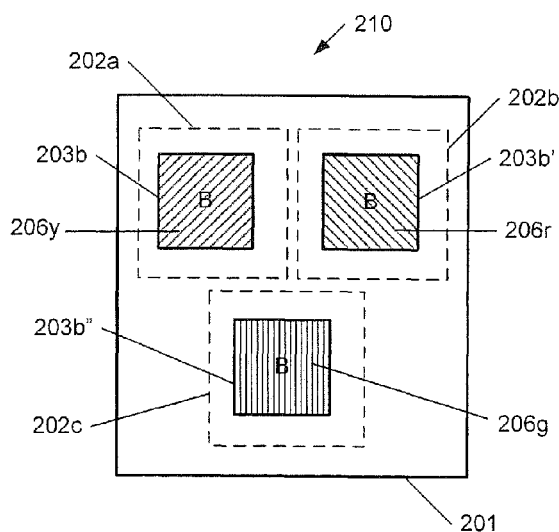
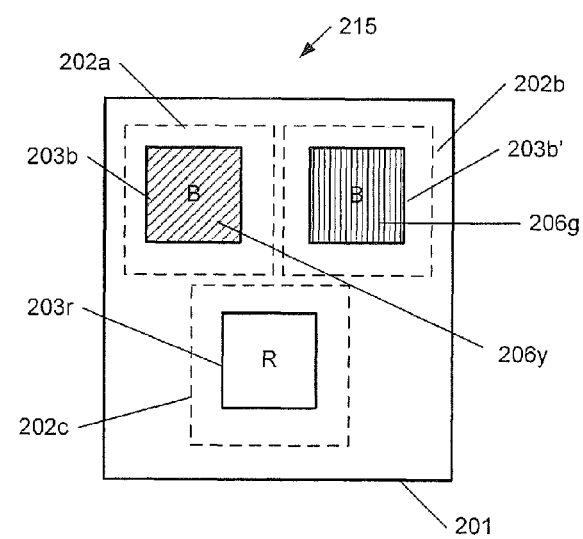
FIG. 2C          FIG. 2D

MULTI-CHIP LIGHT EMITTING DEVICE LAMPS FOR PROVIDING HIGH-CRI WARM WHITE LIGHT AND LIGHT FIXTURES INCLUDING THE SAME

CROSS-REFERENCE TO RELATED APPLICATIONS

The present application is a continuation-in-part of and claims priority from U.S. patent application Ser. No. 11/032,363 filed Jan. 10, 2005, now U.S. Pat. No. 7,564,180 the disclosure of which is incorporated by reference herein in its entirety.

FIELD OF THE INVENTION

This invention relates to semiconductor light emitting devices, and more particularly, to multi-chip semiconductor light emitting devices including wavelength conversion materials and related devices.

BACKGROUND OF THE INVENTION

Light emitting diodes and laser diodes are well known solid state lighting elements capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact may be formed on a p-type region of the device (typically, an exposed p-type epitaxial layer) and a cathode ohmic contact may be formed on an n-type region of the device (such as the substrate or an exposed n-type epitaxial layer).

LEDs may be used in lighting/illumination applications, for example, as a replacement for conventional incandescent and/or fluorescent lighting. As such, it is often desirable to provide a lighting source that generates white light having a relatively high color rendering index (CRI), so that objects illuminated by the lighting may appear more natural. The color rendering index of a light source is an objective measure of the ability of the light generated by the source to accurately illuminate a broad range of colors. The color rendering index ranges from essentially zero for monochromatic sources to nearly 100 for incandescent sources. The color quality scale (CQS) is another objective measure for assessing the quality of light, and similarly ranges from essentially zero to nearly 100.

In addition, the chromaticity of a particular light source may be referred to as the "color point" of the source. For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the color or hue of the white light source. White light typically has a CCT of between about 4000 and 8000 K. White light with a CCT of 4000 has a yellowish color. White light with a CCT of 8000 K is more bluish in color, and may be referred to as "cool white". "Warm white" may be used to describe white light with a CCT of between about 2600 K and 6000 K, which is more reddish in color.

In order to produce white light, multiple LEDs emitting light of different colors of light may be used. The light emitted by the LEDs may be combined to produce a desired intensity and/or color of white light. For example, when red-, green- and blue-emitting LEDs are energized simultaneously, the resulting combined light may appear white, or nearly white, depending on the relative intensities of the component red, green and blue sources. However, in LED lamps including red, green, and blue LEDs, the spectral power distributions of the component LEDs may be relatively narrow (e.g., about 10-30 nm full width at half maximum (FWHM)). While it may be possible to achieve fairly high luminous efficacy and/or color rendering with such lamps, wavelength ranges may exist in which it may be difficult to obtain high efficiency (e.g., approximately 550 nm).

In addition, the light from a single-color LED may be converted to white light by surrounding the LED with a wavelength conversion material, such as phosphor particles. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" may be used herein to refer to materials that are sometimes called fluorescent and/or phosphorescent. In general, phosphors absorb light having shorter wavelengths and re-emit light having longer wavelengths. As such, some or all of the light emitted by the LED at a first wavelength may be absorbed by the phosphor particles, which may responsively emit light at a second wavelength. For example, a single blue emitting LED may be surrounded with a yellow phosphor, such as cerium-doped yttrium aluminum garnet (YAG). The resulting light, which is a combination of blue light and yellow light, may appear white to an observer.

However, light generated from a phosphor-based solid state light source may have a relatively low CRI. In addition, while light generated by such an arrangement may appear white, objects illuminated by such light may not appear to have natural coloring due to the limited spectrum of the light. For example, as the light from a blue LED covered by a yellow phosphor may have little energy in the red portion of the visible spectrum, red colors in an object may not be well-illuminated. As a result, the object may appear to have an unnatural coloring when viewed under such a light source. Accordingly, it is known to include some red-emitting phosphor particles to improve the color rendering properties of the light, i.e., to make the light appear more "warm". However, over time, the red-emitting phosphor particles may be subject to greater degradation than the yellow-emitting phosphor particles, which may decrease the useful lifetime of the light source.

Accordingly, there is a continued need for improved LED lighting sources for general illumination.

SUMMARY OF THE INVENTION

A multi-chip light emitting device (LED) lamp for providing white light according to some embodiments of the invention includes a submount including first and second die mounting regions. A first LED chip is mounted on the first die mounting region, and a second LED chip is mounted on the second die mounting region. The LED lamp is configured to emit light having a spectral distribution including at least four different color peaks to provide the white light. In some embodiments, the first and second LED chips are configured to emit light of a same color. In other embodiments, the first LED chip is configured to emit light of a first color, and the second LED chip is configured to emit light of a second color.

In some embodiments, the lamp may include a first conversion material at least partially covering the first LED chip and configured to absorb at least some of the light of the first color and re-emit light of a third color. In addition, the lamp may include a second conversion material at least partially covering the first and/or second LED chips and configured to absorb at least some of the light of the first and/or second colors and re-emit light of a fourth color. In some embodiments, the coverage of the first and second conversion materials may not overlap.

In other embodiments, the first and second conversion materials may be configured to re-emit light having a greater wavelength than that of the light emitted by the first and/or second LED chips. For example, the first LED chip may be configured to emit light within a blue wavelength range, the second LED chip may be configured to emit light within a cyan wavelength range, the first conversion material may be a yellow-emitting phosphor, and the second conversion material, au be a red-emitting phosphor.

In some embodiments, the first conversion material may be a first semiconductor layer on the first LED chip, and the second conversion material may be a second semiconductor layer on the second LED chip. The first and second semiconductor layers may have respective bandgaps that are narrower than those of quantum wells of the first and second LED chips. The first and/or second semiconductor layers may further include a quantum well structure.

In other embodiments, the submount may further include a third die mounting region thereon, and the lamp may include a third LED chip mounted on the third die mounting region. The third LED chip may be configured to emit light of a third color. A conversion material may at least partially cover the first LED chip, and may be configured to absorb at least some of the light of the first color and re-emit light of a fourth color.

In some embodiments, the third LED chip may be configured to emit light having a wavelength greater than that of the second LED chip. In addition, the second LED chip may be configured to emit light having a wavelength greater than that of the first LED chip. The conversion material may be configured to re-emit light having a wavelength between that of the second LED chip and that of the third LED chip.

In other embodiments, the first LED chip may be configured to emit light within a blue wavelength range, the second LED chip may be configured to emit light within a cyan wavelength range, and the third LED chip may be configured to emit light within a red wavelength range.

In some embodiments, the conversion material may be a yellow-emitting phosphor. For example, the conversion material may be yttrium aluminum garnet.

In other embodiments, the first LED chip may be configured to emit light at a peak wavelength of about 440-470 nm, the second LED chip may be configured to emit light at a peak wavelength of about 495-515 nm, and the third LED chip may be configured to emit light at a peak wavelength of about 610-630 nm.

In some embodiments, a combination of the light emitted from the first, second, and third LED chips and the conversion material may have an average wavelength of about 555 nm.

Also, a combination of the light emitted from the first, second, and third LED chips and the conversion material may have a color temperature of about 2600 K to about 6000 K. Furthermore, a combination of the light emitted from the first, second, and third LED chips and the conversion material may have a color-rendering index (CRI) of about 90-99.

According to other embodiments of the present invention, a light emitting device (LED) light fixture for providing white light includes a mounting plate and a plurality of multi-chip LED lamps attached to the mounting plate. Each of the plurality of multi-chip LED lamps includes a submount including first and second die mounting regions thereon attached to the mounting plate. A first LED chip configured to emit light of a first color is mounted on the first die mounting region, and a second LED chip configured to emit light of a second color is mounted on the second die mounting region of the submount. At least one of the plurality of multi-chip LED lamps is configured to emit light having a spectral distribution including at least four different color peaks to provide the white light.

In some embodiments, the at least one of the plurality of multi-chip LED lamps may further include first and second conversion materials. The first conversion material may at least partially cover the first LED chip, and may be configured to absorb at least some of the light of the first color and re-emit light of a third color. The second conversion material may at least partially cover the first and/or second LED chips, and may be configured to absorb at least some of the light of the first and/or second colors and re-emit light of a fourth color.

In other embodiments, the at least one of the plurality of multi-chip LED lamps may further include a third LED chip configured to emit light of a third color mounted on a third die mounting region of the submount. In addition, a conversion material may at least partially cover the first LED chip, and may be configured to absorb at least some of the light of the first color and re-emit light of a fourth color.

In some embodiments, the first, second, and third LED chips of ones of the plurality of multi-chip LED lamps may be individually addressable. In addition, the LED light fixture may further include a control circuit electrically coupled to the plurality of multi-chip LED lamps. The control circuit may be configured to respectively apply first, second, and third drive currents to the first, second, and third LED chips in ones of the plurality of multi-chip LED lamps at a predetermined current ratio. For example, the control circuit may be configured to independently apply first, second, third, and/or fourth drive currents to first, second, third, and/or fourth LED chips at a ratio depending on the brightness and/or wavelength(s) of the LED chip(s) and/or on the brightness and/or wavelengths of the converted light from the conversion material(s) to achieve desired color coordinates and/or color point. As such, a combination of the light emitted from the first, second, and third LED chips and the phosphor coating may have a color temperature of about 2600 K to about 6000 K, an average wavelength of about 555 nm, and/or a color-rendering index (CRI) of about 95.

In other embodiments, the light fixture may further include at least one single-chip LED lamp attached to the mounting plate adjacent the plurality of multi-chip LED lamps.

According to further embodiments of the present invention, a multi-chip light emitting device (LED) lamp for providing white light includes a submount including first and second die mounting regions thereon. A blue LED chip is mounted on the first die mounting region and is configured to emit light within a blue wavelength range responsive to a first bias current. A cyan LED chip is mounted on the second die mounting region and is configured to emit light within a red wavelength range responsive to a second bias current. A phosphor material at least partially covers the blue LED chip and is configured to convert at least some of the light within the blue wavelength range to light within a yellow wavelength range.

In some embodiments, a second phosphor material at least partially covers the cyan LED chip and may be configured to convert at least some of the light within the cyan wavelength range to light within a red wavelength range.

In other embodiments, a red LED chip may be mounted on a third die mounting region and may be configured to emit light within a cyan wavelength range responsive to a third bias current.

According to still further embodiments of the present invention, a method of operating a multi-element light emitting device (LED) lamp having blue, cyan, and red LED chips includes independently applying first, second, and third drive currents to the blue, cyan, and red LED chips. As such, a combination of the light emitted from the blue, cyan, and red LED chips may provide white light having a color temperature of about 2600 K to about 6000 K, an average wavelength of about 555 nm, and/or a color-rendering index (CRI) of about 90-99.

According to still further embodiments of the present invention, a multi-chip light emitting device (LED) lamp for providing white light includes a submount including a die mounting region thereon, an LED chip mounted on the die mounting region and configured to emit light of a first color, and a semiconductor layer on the LED chip. The semiconductor layer is configured to absorb at least some of the light of the first color and re-emit light of another color. The semiconductor layer may be a direct bandgap semiconductor material having a narrower bandgap than that of quantum wells of the LED chip. In some embodiments, the semiconductor layer may include a quantum well structure.

BRIEF DESCRIPTION OF THE DRAWINGS

FIGS. 2A-2D are top views illustrating light emitting device lamps according to some embodiments of the invention.

DETAILED DESCRIPTION OF EMBODIMENTS OF THE INVENTION

Figure 1A:
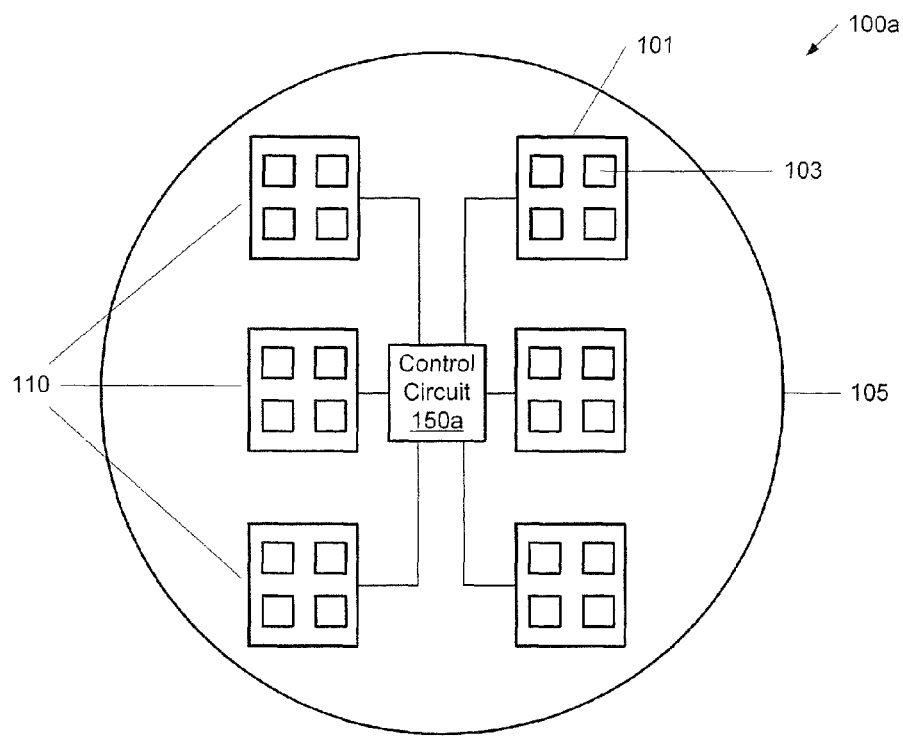
FIG. 1A is a top view illustrating a light emitting device light fixture according to some embodiments of the invention.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, the term "semiconductor light emitting device" and/or "LED" may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrates. A light emitting device may include one or more contact layers which may include metal and/or other conductive layers. In some embodiments, ultraviolet, blue, cyan, and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. Some embodiments of the present invention may use LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may also be configured to operate such that light emission occurs through the substrate.

Some embodiments of the present invention provide multi-chip LED lamps and related light fixtures for high brightness applications, such as recessed or "can" lighting. LED light fixtures according to some embodiments of the present invention may offer longer life and/or greater energy efficiency, and may provide white light output that is comparable to that of conventional light sources, such as incandescent and/or fluorescent light sources. In addition, LED light fixtures according to some embodiments of the present invention may match and/or exceed the brightness output, performance, and/or CRI of conventional light sources, while maintaining a similar fixture size.

Figure 1B:
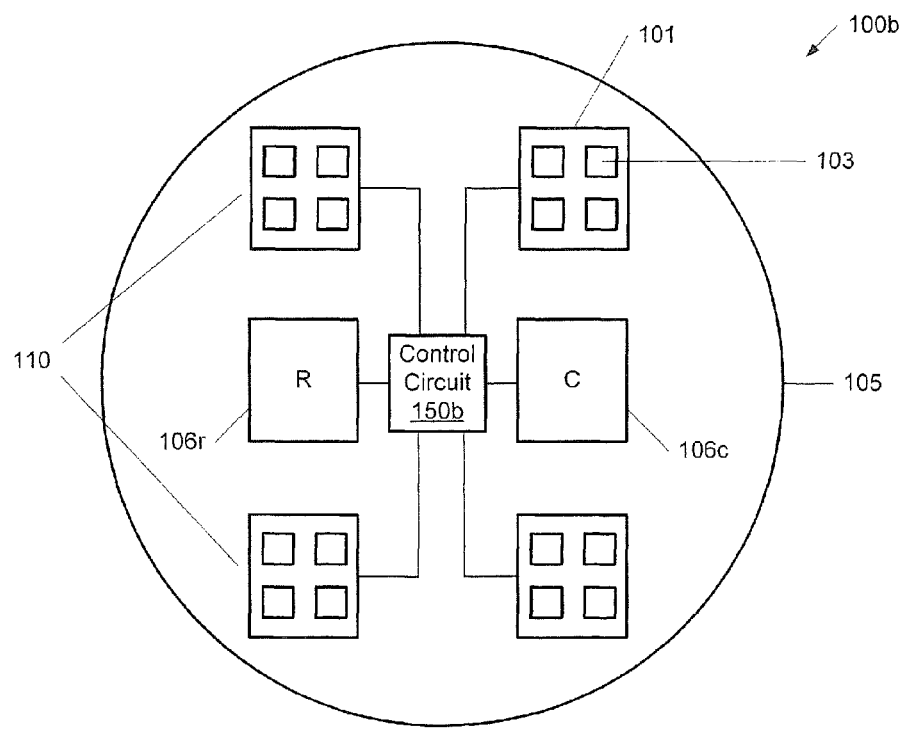
FIG. 1B is a top view illustrating a light emitting device light fixture according to further embodiments of the invention.

FIGS. 1A and 1B illustrate LED light fixtures according to some embodiments of the present invention. Referring now to FIG. 1A, a light fixture 100a includes a mounting plate 105 including multiple multi-chip LED lamps 110 attached to the mounting plate 105. Although illustrated as having a circular shape, the mounting plate 105 may be provided in other shapes as well. As used herein, a "multi-chip LED lamp" includes at least two LED chips, each of which may be configured to emit the same or different colors of light, mounted on a common substrate or submount. As shown in FIG. 1A, each multi-chip LED lamp 110 includes four LED chips 103 mounted on a common submount 101. In some embodiments, one or more of the multi-chip LED lamps 110 may be configured to provide white light based on the combination of the colors of light emitted by each of its component LED chips 103. For example, one or more of the multi-chip LED lamps 110 may be configured to emit light having a spectral distribution including at least four different color peaks (i.e., having local peak wavelengths in wavelength ranges corresponding to at least four different colors of light) to provide the white light. Examples of LED color combinations in multi-chip lamps according to some embodiments of the present invention will be provided below with reference to FIGS. 2A-2D and FIGS. 3A-3E. The multi-chip lamps 110 may be grouped on the mounting plate 105 in clusters and/or other arrangements such that the light fixture 100a outputs a desired pattern of light.

Still referring to FIG. 1A, the light fixture 100a further includes a control circuit 150a electrically coupled to each of the multi-chip LED lamps 110. The control circuit is configured to operate the lamps 110 by independently applying drive currents to the individual LED chips 103 in each lamp 110. In other words, each of the LED chips 103 in each lamp 110 may be configured to be individually addressed by the control circuit 150a. For example, the control circuit 150a may include a current supply circuit configured to independently apply an on-state drive current to each of the individual LED chips 103 responsive to a control signal, and a control system configured to selectively provide the control signals to the current supply circuit. As LEDs are current-controlled devices, the intensity of the light emitted from an LED is related to the amount of current driven through the LED. For example, one common method for controlling the current driven through an LED to achieve desired intensity and/or color mixing is a Pulse Width Modulation (PWM) scheme, which alternately pulses the LEDs to a full current "ON" state followed by a zero current "OFF" state. Accordingly, the control circuit 150a may be configured to control the current driven through the LED chips 103 using one or more control schemes as are well known in the art.

While not illustrated in FIG. 1A, the light fixture 100a may further include one or more heat spreading components and/or sinks for spreading and/or removing heat emitted by the LED chips 103. For example, a heat spreading component may include a sheet of thermally conductive material having an area and configured to conduct heat generated by the LED chips 103 of the light fixture 100a and spread the conducted heat over the area of the mounting plate 105 to reduce thermal nonuniformities in the light fixture 100a. The heat spreading component may be a solid material, a honeycomb or other mesh material, an anisotropic thermally conductive material, such as graphite, and/or other materials.

FIG. 1B illustrates an LED light fixture 100b according to further embodiments of the present invention. As shown in FIG. 1B, the light fixture 100b includes a mounting plate 105 and a plurality of multi-chip LED lamps 110 attached to the mounting plate 105 in an arrangement and/or pattern selected to provide a desired light output, similar to that of the LED light fixture 100a of FIG. 1A. The light fixture 100b further includes one or more single-chip LED lamps attached to the mounting plate 105 in combination with the multi-chip lamps 110. As used herein, a "single-chip LED lamp" refers to an LED lamp including only one LED chip. For example, one single-chip LED lamp may be included in each grouping of multi-chip LED lamps to provide up to a 2 to 4:1 ratio of multi-chip LED lamps to single-chip LED lamps. However, depending on the desired color point, the ratio may be higher or lower.

More particularly, as illustrated in FIG. 1B, the light fixture 100b includes two single-chip LED lamps 106r and 106c.

The lamp 106r is configured to emit light in a red wavelength range (e.g., 610-630 nm), while the lamp 106c is configured to emit light in a cyan wavelength range (e.g., 485-515 nm). However, single-chip LED lamps configured to emit light of other colors may also be provided in light fixtures according to some embodiments of the present invention. The single-chip LED lamps 106r and/or 106c may be used to adjust the CRI and or CCT of the light output by the light fixture 100b. For example, the lamp 106r may be used to provide additional light in the red wavelength range such that the overall light provided by the light fixture 100b may appear to be a "warmer" color of white light. More particularly, the white light output by the LED light fixture 100b may have a color temperature in the range of about 2600 degrees Kelvin (K) to about 6000 K. Additional single-chip LED lamps may also be attached to the mounting plate 105 in a desired pattern to adjust the CRI and/or CCT of the output light and/or to provide a particular ratio of white-emitting multi-chip LED lamps to colored single-chip LED lamps.

The light fixture 100b also includes a control circuit 150b electrically coupled to each of the multi-chip LED lamps 110 as well as the single-chip LED lamps 106r and 106c, in a manner similar to that discussed above with reference to FIG. 1A. The control circuit 150b is configured to independently apply drive currents to the LED chips 103 of the multi-chip lamps 110 and/or to the single-chip LED lamps 106r and/or 106c to individually control the intensities of light provided thereby, for example using PWM and/or other control schemes as are well known in the art. In addition, although not illustrated in FIG. 1B, the light fixture 100b may further include one or more heat spreading components for spreading and/or removing heat emitted by the single-chip and/or multi-chip LED lamps, as also discussed above with reference to FIG. 1A.

LED light fixtures according to some embodiments of the present invention, such as the LED light fixtures 100a and/or 10b, may provide a number of features and/or benefits. For example, LED light fixtures including multiple multi-chip lamps according to some embodiments of the present invention may provide a relatively high luminous efficacy (as expressed in lumens per watt) for a given CRI. More particularly, conventional light fixtures may offer 10-20 lumens per watt for a CRI of 90, while LED light fixtures according to some embodiments of the present invention may offer 60-85 lumens per watt for the same CRI. In addition, LED light fixtures according to some embodiments of the present invention may offer greater lumens per watt per square inch than conventional light fixtures. As such, although light fixtures including multi-chip LED lamps according to some embodiments of the present invention may be more costly than those including comparable single-chip lamps, the cost per lumen may be significantly less. Also, the CRI may be adjusted by using different combinations of single-chip LED lamp colors with the multi-chip LED lamps. For example, the ratio of white-emitting LED lamps to single-chip color LED lamps may be about 2:1 to about 4:1 depending on fixture size, desired CRI, and/or desired color point. For larger area troffer fixtures, a ratio of greater than about 10:1 may be desired. In addition, LED lamps and/or light fixtures according to some embodiments of the present invention may be manufactured using off-the-shelf components, and as such, may be more cost-effective to produce.

Although FIGS. 1A and 1B illustrates examples of LED light fixtures according to some embodiments of the present invention, it will be understood that the present invention is not limited to such configurations. For example, although illustrated in FIGS. 1A and 1B as attached to the same face of the mounting plate 105 as the LED chips 103, it is to be understood that the control circuits 150a and/or 150b may be attached to an opposite or back face of the mounting plate 105 and/or may be provided in a separate enclosure in some embodiments of the present invention. In addition, fewer or more multi-chip LED lamps and/or single-chip LED lamps may be attached to the mounting plate 105, for example, depending on the desired light output. Also, although illustrated with reference to multi-chip lamps 110 including four LED chips 103 per lamp, multi-chip lamps with fewer or more LED chips per lamp may also be used in multi-chip LED light fixtures according to some embodiments of the present invention. Moreover, the multi-chip LED lamps 110 need not all be identical. For example, some of the multi-chip LED lamps may include a red LED chip, a green LED chip, and a blue LED chip, while others may include two blue LED chips and a red LED chip. Additional configurations of multi-chip LED lamps will be discussed in greater detail below with reference to FIGS. 2A-2D and 3A-3E.

FIGS. 2A-2D illustrate examples of multi-chip LED lamps that may be used in light fixtures according to some embodiments of the present invention. Referring now to FIG. 2A, a multi-chip LED lamp 200 includes a common substrate or submount 201 including first and second die mounting regions 202a and 202b. The die mounting regions 202a and 202b are each configured to accept an LED chip, such as a light emitting diode, an organic light emitting diode, and/or a laser diode. As shown in FIG. 2A, first and second LED chips 203b and 203g are mounted on the die mounting regions 202a and 202b of the submount 201, respectively. For example, the LED chips 203b and/or 203g may be EZBright® LED chips manufactured by Cree, Inc. More particularly, as shown in FIG. 2A, the first LED chip 203b is a blue LED chip configured to emit light in a blue wavelength range (i.e., 440-470 nm), while the second LED chip 203g is a green LED chip configured to emit light in a green wavelength range (i.e., 495-570 nm). The blue and/or green LED chips 203b and/or 203g may be InGaN-based blue and/or green LED chips available from Cree, Inc., the assignee of the present invention.

In addition, as illustrated in FIG. 2A, one or more light conversion materials at least partially cover the blue LED chip 203b. More particularly, a yellow-emitting phosphor 206y and a red-emitting phosphor 206r at least partially cover the blue LED chip 203b. The yellow-emitting phosphor 206y is configured to absorb at least a portion of the light emitted by the blue LED chip 203b and re-emit light in a yellow wavelength range, while the red-emitting phosphor 206r is configured to absorb at least a portion of the light emitted by the blue LED chip 203b and re-emit light in a red wavelength range. As such, the blue and green LED chips 203b and 203g may be independently energized and/or driven by a control circuit, such as the control circuit 150a of FIG. 1A, such that white light is output by the LED lamp 200. As an alternative, in some embodiments, the blue LED chip 203b may be covered by only the yellow-emitting phosphor 206y, and the LED chip 203g may be a cyan LED chip at least partially covered by the red-emitting phosphor 206r. Accordingly, the multi-chip LED lamp 200 of FIG. 2A includes two LED chips 203b and 203g configured to emit light of four different colors to provide the white light output.

FIG. 2B illustrates an LED lamp 205 according to some embodiments of the present invention including a common submount 201 having first, second, and third die mounting regions 202a, 202b, and 202c, and blue, green, and red LED chips 203b, 203g, and 203r respectively mounted on the die mounting regions 202a, 202b, and 202c. The red LED chip 203r is configured to emit light in a red wavelength range (i.e., 610-630 nm), and may be an AlInGaP LED chip available from Epistar, Osram and others. The LED lamp 205 further includes a fourth die mounting region 202d and fourth LED chip mounted on the fourth die mounting region 202d, illustrated in FIG. 2B as a cyan LED chip 203c. The cyan LED chip 203c is configured to emit light in a cyan wavelength range (i.e., 485-515 nm). The blue, green, red, and cyan LED chips 203b, 203g, 203r and 203c may be independently energized and/or driven by a control circuit, such that the combination of the emitted light may provide while light output from the LED lamp 205. The white light output from the LED lamp 205 also includes additional light available in the cyan wavelength range as compared to the LED lamp 200 of FIG. 2A. In other words, the fourth LED chip 203c may be used to improve color rendering and/or efficiency for the LED lamp 205 in particular wavelength ranges. However, it is to be understood that LED chips configured to emit light in other wavelength ranges, such as in the amber wavelength range, may be mounted on the fourth die mounting region 302d depending on the desired white light output for the LED lamp 205.

FIG. 2C illustrates an LED lamp 210 also including a common submount 201 having three die mounting regions 202a, 202b, and 202c. However, in FIG. 2C, three blue LED chips 203b, 203b', and 203b" are mounted on the die mounting regions 202a, 202b, and 202c, respectively. In addition, a different conversion material at least partially covers each of the blue LED chips 203b, 203b', and 203b". More particularly, as shown in FIG. 2C, a yellow-emitting phosphor 206y at least partially covers the blue LED chip 203b, a red-emitting phosphor 206r at least partially covers the blue LED chip 203b', and a green-emitting phosphor 206g at least partially covers the blue LED chip 203b". For example, the yellow-emitting phosphor 206y may include yttrium aluminum garnet (YAG) crystals which have been powdered and/or bound in a viscous adhesive. The yellow-emitting phosphor 206y may be configured to exhibit luminescence when photoexcited by the blue light emitted from the blue LED chip 203b. In other words, the yellow-emitting phosphor 206y is configured to absorb at least a portion of the light emitted by the blue LED chip 203b and re-emit light in a yellow wavelength range (i.e., 570-590 nm). Similarly, the red-emitting phosphor 206r is configured to absorb at least a portion of the light emitted by the blue LED chip 203b' and re-emit light in a red wavelength range (i.e., 610-630 nm), while the green-emitting phosphor 206g is configured to absorb at least a portion of the light emitted by the blue LED chip 203b" and re-emit light in a green wavelength range (i.e., 495-570 nm). As such, the combination of light emitted by the three blue LED chips 203b, 203b', and 203b" and the light emitted by the phosphors 206y, 206r, and 206g may provide white light output from the LED lamp 210.

FIG. 2D illustrates an LED lamp 215 according to still further embodiments of the present invention. The LED lamp 215 similarly includes a common submount 201 having three die mounting regions 202a, 202b, and 202c. Two blue LED chips 203b and 203b' are respectively mounted on the die mounting regions 202a and 202b of the submount 301. In addition, a red LED chip 203r is mounted on the third die mounting region 202c. A conversion material, illustrated as a yellow-emitting phosphor 206y, at least partially covers the blue LED chip 203b. Similarly, another conversion material, illustrated as a green-emitting phosphor 206g, at least partially covers the blue LED chip 203b'. However, the yellow-emitting phosphor 206y and the green-emitting phosphor 206g are not provided on the red LED chip 203r. Accordingly, the combination of light emitted by the blue LED chips 203b and 203b' and the light emitted by the yellow-emitting phosphor 206y and the green-emitting phosphor 206g may provide white light, while the light emitted by the red LED chip 203r may improve the color rendering properties of the light. In other words, the addition of the light from the red LED chip 203r may make the light output by the LED lamp 215 appear to be more "warm." As an alternative, in some embodiments, the LED chip 203r may be a green LED chip, and the phosphor 206g may be a red-emitting phosphor.

Although FIGS. 2A-2D illustrate examples of multi-chip LED lamps that may be used in LED light fixtures according to some embodiments of the present invention, it will be understood that the present invention is not limited to such configurations. For example, in some embodiments, one or more of the LED chips of the multi-chip LED lamps may be covered by an encapsulant, which may be clear and/or may include light scattering particles, phosphors, and/or other elements to achieve a desired emission pattern, color and/or intensity. While not illustrated in FIGS. 2A-2D, the LED lamps may further include reflector cups surrounding the LED chips, one or more lenses mounted above the LED chips, one or more heat sinks for removing heat from the lighting device, an electrostatic discharge protection chip, and/or other elements. For example, in some embodiments, the submount 201 may include one or more heat sinks.

Figure 3A:
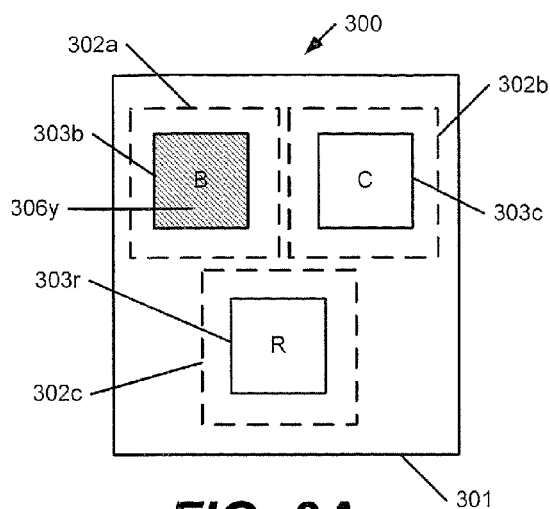
FIGS. 3A-3F are top views illustrating light emitting device lamps according to further embodiments of the invention.

FIGS. 3A-3F illustrate multi-chip LED lamps according to further embodiments of the present invention. The LED lamps of FIGS. 3A-3F may be used in LED light fixtures according to some embodiments of the present invention, such as the LED light fixtures 100a and 100b of FIGS. 1A and 1B. Referring now to FIG. 3A, an LED lamp 300 includes a common substrate or submount 301 including first, second, and third die mounting regions 302a, 302b, and 302c. The die mounting regions 302a, 302b, and 302c are each configured to accept an LED chip, such as a light emitting diode, an organic light emitting diode, and/or a laser diode. As shown in FIG. 3A, first, second, and third LED chips 303b, 303c, and 303r are mounted on the die mounting regions 302a, 302b, and 302c of the submount 301, respectively. For example, the LED chips 303b, 303c, and/or 303r may be EZBright® LED chips manufactured by Cree, Inc. In some embodiments, the LED chips 303b, 303c, and 303r may be vertical devices including a cathode contact on one side the chip and an anode contact on an opposite side of the chip.

In addition, a conversion material at least partially covers the first LED chip 303b. For example, the conversion material may be a phosphor, polymer, and/or dye that is configured to absorb at least some of the light emitted by the first LED chip 303b and re-emit light of a different color. In other words, the conversion material may be photoexcited by the light emitted from the first LED chip 303b, and may convert at least a portion of the light emitted by the first LED chip 303b to a different wavelength. In FIG. 3A, the conversion material is illustrated as a yellow-emitting phosphor 306y. In some embodiments, the yellow-emitting phosphor 306y may be yttrium aluminum garnet (YAG). The yellow-emitting phosphor 306y may be provided to cover the LED chip 303b using many different techniques. For example, the yellow-emitting phosphor 306y may be included in an encapsulant material in a plastic shell surrounding the blue LED chip 303b. In addition and/or alternatively, the yellow-emitting phosphor 306y may be directly coated on the blue LED chip 303b itself, for example, as described in US Patent Publication No. 2006/0063289, assigned to the assignee of the present invention. In other techniques, the yellow-emitting phosphor 306y may be coated on the LED chip 303b using spin coating, molding, screen printing, evaporation and/or electrophoretic deposition.

The LED chips 303b, 303c, and 303r may be selected such that the third LED chip 303r emits light having a wavelength longer than that of the second LED chip 303c, and such that the second LED chip 303c emits light having a wavelength longer than that of the first LED chip 303b. The conversion material 306y may be selected to emit light having a wavelength between that of the second LED chip 303c and the third LED chip 303r. More particularly, as shown in FIG. 3A, a blue LED chip 303b is mounted on the first die mounting region 302a, a cyan LED chip 303c is mounted on the second die mounting region 302b, and a red LED chip 303r is mounted on the third die mounting region 302c. The blue LED chip 303b is configured to emit light within a blue wavelength range (i.e., about 440 to about 490 nm). The red LED chip 303r is configured to emit light within a red wavelength range (i.e., about 610 to about 630 nm). The cyan LED chip 303c is configured to emit light within a cyan wavelength range that is between that of the blue and red LED chips 303b and 303r, for example, about 485 to about 515 nm. In addition, the yellow-emitting phosphor 306y is configured to emit light within a wavelength range between that of the blue and red LED chips 303b and 303r, for example, about 570 to about 590 nm. Alternatively, in some embodiments, the third LED chip 303r may be a green LED chip configured to emit light within a green wavelength range (i.e., about 495 to about 570 nm).

Still referring to FIG. 3A, the blue, red, and cyan LED chips 303b, 303r, and 303c may be independently energized and/or driven by a control circuit, such as the control circuit 150a of FIG. 1A, to provide a desired white light output from the LED lamp 300. For example, for warm white light applications, first, second, and third drive currents may be applied to the blue, cyan, and red LED chips 303b, 303c, and 303r in a ratio such that the correlated color temperature of the light emitted from the LED lamp 300 is about 2600 K to about 6000 K. The current ratio may be a function of the brightness and/or wavelengths of light emitted by the respective LED chips and/or the brightness and/or wavelengths of the converted light from the conversion material(s) to achieve a desired color point. In addition, the cyan LED chip 303c and the yellow-emitting phosphor 306y may provide light in the intermediate spectrum between the wavelengths of light emitted by the blue and red LED chips 303b and 303r, such that an average wavelength of the combination of the light emitted by the LED lamp 300 is about 555 nm. More particularly, in some embodiments, the blue LED chip 303b may emit light having a peak wavelength of about 460 nm, red LED chip 303r may emit light having a wavelength of about 610 nm, the cyan LED chip 303c may emit light having a peak wavelength of about 505 nm, and the yellow-emitting phosphor 306y may emit light having a peak wavelength of about 580 nm. In contrast, conventional LED lamps including red, blue, and green LED chips may operate less efficiently at such wavelengths, as discussed above. Also, the addition of the cyan LED chip 303c may improve the CRI of the LED lamp 300 as compared to a conventional lamp using a red LED chip in combination with a blue LED chip coated with a yellow phosphor. For example, LED lamps according to some embodiments of the present invention may have a CRI of about 90-99.

Figure 3B:
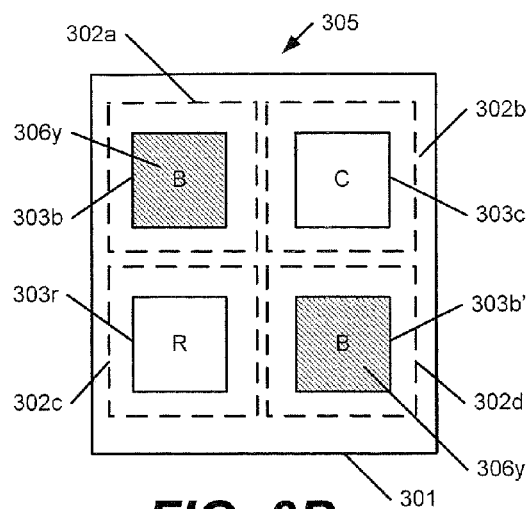

FIGS. 3B-3F illustrate alternate configurations of LED lamps according to some embodiments of the present invention. The LED chips of the lamps of FIGS. 3B-3E may have similar characteristics and/or may be independently operated to provide white light having substantially similar characteristics as those described above with reference to FIG. 3A. Referring now to FIG. 3B, an LED lamp 305 includes a common submount 301 having three die mounting regions 302a, 302b, and 302c, and blue, cyan, and red LED chips 303b, 303c, and 303r respectively mounted on the die mounting regions 302a, 302b, and 302c. The LED lamp 305 further includes a fourth die mounting region 302d and fourth LED chip mounted on the fourth die mounting region 302d, illustrated in FIG. 3B as another blue LED chip 303b'. However, it is to be understood that, in some embodiments, LED chips configured to emit light of other colors, such as green and/or amber, may be mounted on the fourth die mounting region 302d. The first and fourth die mounting regions 302a and 302d are diametrically opposed on the submount 301. As such, the two blue LED chips 303b and 303b' are provided at diagonally opposite positions on the submount 301. A yellow-emitting phosphor 306y at least partially covers both of the blue LED chips 303b and 303b'; however, the phosphor 306y is not provided on the red and cyan LED chips 303r and 303c. Accordingly, the combination of the light emitted by the blue LED chips 303b and 303b' and the yellow-emitting phosphor 306y may produce white light, and the diametrically opposed positions of the blue LED chips 303b and 303b' may provide a more even light distribution. Also, the additional light emitted by the red and cyan LED chips 303r and 303c may improve the color rendering properties of the overall light output of the LED lamp 305. As an alternative, in some embodiments, the LED chip 303c may be a blue LED chip at least partially covered by a green or yellowish-green phosphor, such as LuAG (Lanthanide+YAG).

Figure 3C:
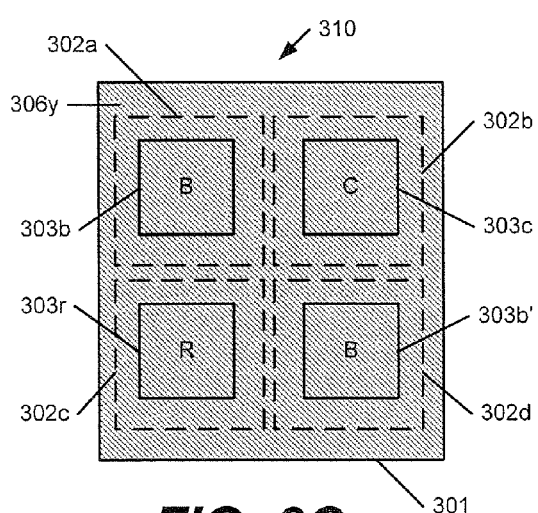

FIG. 3C also illustrates an LED lamp 310 including two diametrically opposed blue LED chips 303b and 303b', a cyan LED chip 303c, and a red LED chip 303r mounted on a common submount 301 in a manner similar to that of the LED lamp 305 of FIG. 3B. However, as shown in FIG. 3C, a conversion material containing a yellow-emitting phosphor 306y at least partially covers all of the LED chips 303b, 303b', 303c, and 303r on the submount 301. For example, in some embodiments, the yellow-emitting phosphor 306y may be configured to convert at least a portion of the blue light emitted from the blue LED chips 303b and 303b' into yellow light. In some embodiments, the conversion material may further include a red-emitting phosphor in addition to the yellow-emitting phosphor 306y.

Figure 3D:
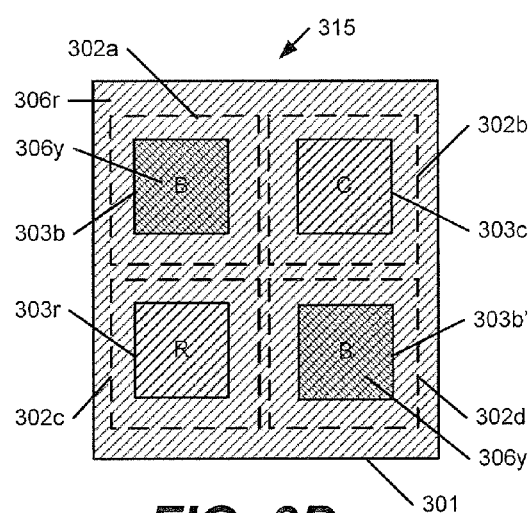

FIG. 3D illustrates an LED lamp 315 including two diametrically opposed blue LED chips 303b and 303b', a cyan LED chip 303c, and a red LED chip 303r mounted on the submount 301 in a manner similar to that of the LED lamp 305 of FIG. 3B. A first conversion material, illustrated as a yellow-emitting phosphor 306y, at least partially covers both of the blue LED chips 303b and 303b' but is not provided on the red and cyan LED chips 303r and 303c. In addition, a second conversion material, illustrated as a red-emitting phosphor 306r, at least partially covers all of the LED chips 303b, 303b', 303c, and 303r on the submount 301. For example, the red-emitting phosphor 306r may be included along with yellow-emitting phosphor 306y on blue LED chips 303b and 303b' to improve the color rendering characteristics of the light produced by the blue LED chips 303b and 303b'. More particularly, the red phosphor 306r may also emit light in response to stimulation by light emitted by the blue LED chips 303b and 303b', and may thus provide an additional red light emission complement to the overall light emitted by the LED lamp 315. The resulting light may have a warmer appearance, which may give objects a more natural appearance when illuminated.

However, the excitation curve of the red phosphor 306r may overlap with the emission curve of the yellow emitting phosphor 306y, meaning that some light emitted by the yellow phosphor 306y may be reabsorbed by the red phosphor 306r, which may result in a loss of efficiency. As such, in some embodiments, the first and/or second conversion materials may be provided in discrete phosphor-containing regions. For example, the yellow 306y and red 306r emitting phosphors may be provided in two separate discrete phosphor-containing regions, which may provide improved separation of the different phosphors for warm white, UV/RGB, and other phosphor applications. Further, the discrete phosphor-containing regions formed on the LED structure 315 may be in contact with adjacent phosphor-containing regions and/or may be separated from adjacent phosphor-containing regions. For example, in a warm white LED application, red and yellow phosphors may be physically separated to reduce reabsorption of yellow light by the red phosphors.

Figure 3E:
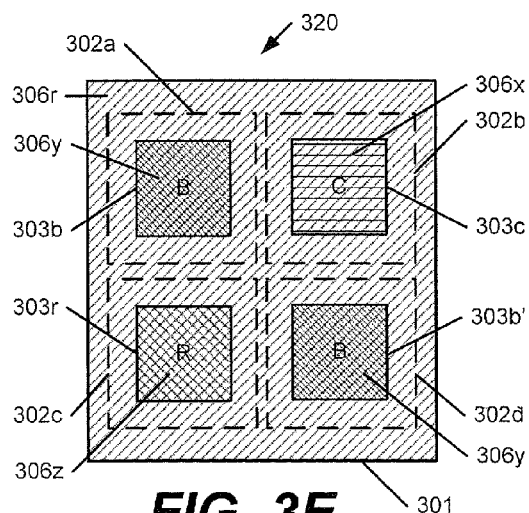

FIG. 3E similarly illustrates an LED lamp 320 including two diametrically opposed blue LED chips 303b and 303b', a cyan LED chip 303c, and a red LED chip 303r mounted on the submount 301. A first conversion material, illustrated as a yellow-emitting phosphor 306y, at least partially covers both of the blue LED chips 303b and 303b' but is not provided on the red and cyan LED chips 303r and 303c, while a second conversion material, illustrated as a red-emitting phosphor 306r, at least partially covers all of the LED chips 303b, 303b', 303c, and 303r on the submount 301. In addition, third and fourth conversion materials 306x and 306z at least partially cover the cyan LED chip 303c and the red LED chip 303r. For example, the third conversion material 306x may be configured to emit light in response to stimulation by light emitted by the cyan LED chip 303c, and the fourth conversion material 306z may be configured to emit light in response to stimulation by the red LED chip 303r to further improve the color rendering characteristics of the light emitted by the LED lamp 320. For example, the third and/or fourth conversion materials 306x and 306z may be a blue emitting phosphor, such as BAM (BaMgAl$_2$O$_3$). In some embodiments, the phosphors 306y, 306r, 306x, and/or 306z may be provided in discrete phosphor-containing regions, as described above. As such, multiple phosphors of different colors may be arranged in a desired pattern on a chip to provide a desired emission pattern.

Figure 3F:
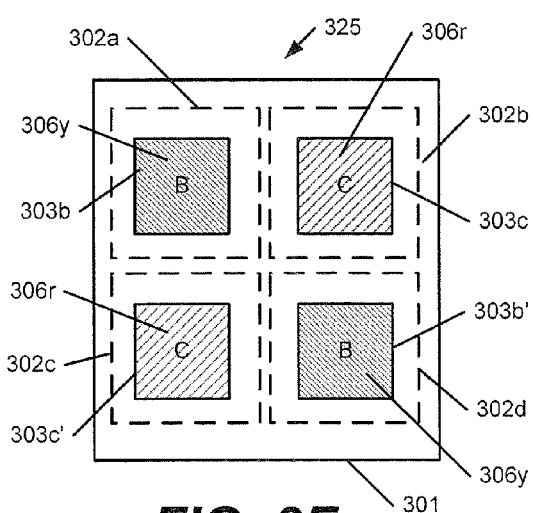

FIG. 3F illustrates an LED lamp 325 including two diametrically opposed blue LED chips 303b and 303b' and two diametrically opposed cyan LED chips 303c and 303c' mounted on the submount 301. A first conversion material, illustrated as a yellow-emitting phosphor 306y, at least partially covers both of the blue LED chips 303b and 303b' but is not provided on the cyan LED chips 303c and 303c'. Similarly, a second conversion material, illustrated as a red-emitting phosphor 306r, at least partially covers both of the cyan LED chips 303c and 303c' but is not provided on the blue LED chips 303b and 303b'. Thus, the LED chip coverage of the yellow and red-emitting phosphors 306y and 306r may not overlap in some embodiments. The yellow-emitting phosphor 306y may emit light in response to stimulation by light emitted by the blue LED chips 303b and 303b' such that the combined light output has a green appearance, and the red phosphor 306r may emit light in response to stimulation by light emitted by the cyan LED chips 303c and 303c' such that the combined light output has an orange appearance. Accordingly, the combination of orange and green light emitted by the LED lamp 325 may provide a white light output having a warmer appearance.

Although FIGS. 3A-3F illustrate exemplary multi-chip LED lamps according to some embodiments of the present invention, it will be understood that some embodiments of the present invention are not limited to such configurations. For example, although the LED lamps of FIGS. 3B-3F illustrate that two out of the four LED chips in each lamp are blue LED chips, it is to be understood that four LED chips of different colors may be provided. More particularly, in some embodiments, one of the blue LED chips may be replaced with a green and/or an amber LED chip depending on the desired white light output. More generally, other permutations of three or more LED chips on a common submount and one or more phosphors covering one or more of the LED chips may be included in some embodiments of the present invention. In addition, the ratio of the drive currents for the individual LED chips may be adjusted to shift the chromaticity and/or color temperature of the white light output by the LED lamp along the blackbody locus. In other words, by adjusting the luminous intensity ratio of the blue, cyan, and red LED chips, the color temperature of the white light can be changed. Also, in some embodiments, the LED chips of the multi-chip LED lamps may be covered by an encapsulant, which may be clear and/or may include light scattering particles, phosphors, and/or other elements to achieve a desired emission pattern, color and/or intensity. While not illustrated in FIGS. 3A-3F, the LED lamps may further include reflector cups surrounding the LED chips, one or more lenses mounted above the LED chips, one or more heat sinks for removing heat from the lighting device, an electrostatic discharge protection chip, and/or other elements. For example, in some embodiments, the submount 301 may include one or more heat sinks.

Tables 1 and 2 illustrate experimental results for color rendering index (CRI) and color quality scale (CQS) values that may be achieved by typical LED lamps, such as those including one or more blue LED chips at least partially covered by a yellow-emitting phosphor.

TABLE 1

| CRI Values | | |
| --- | --- | --- |
| R1 | 69.4 | Brown |
| R2 | 84.0 | Green-Brown |
| R3 | 93.1 | Green-Yellow |
| R4 | 64.5 | Green |
| R5 | 67.0 | Cyan |
| R6 | 74.4 | Blue |
| R7 | 80.1 | Purple |
| R8 | 51.1 | Pink |
| R9 | −10.9 | Strong Red |
| R10 | 60.3 | Strong Yellow |
| R11 | 53.7 | Strong Green |
| R12 | 47.5 | Strong Blue |
| R13 | 72.0 | Caucasian skin |
| R14 | 95.9 | Foliage |
| Ra | 73.0 | |

More particularly, Table 1 illustrates the color rendering index values R1 through R14 of fourteen test colors used to calculate a general color rendering index Ra. The color rendering index values R1 through R8, R13, and R14 illustrate degrees of subtle differences between naturally reproduced colors with intermediate degrees of saturation. In contrast, the special color rendering index values R9 through R12 illustrate degrees of differences between strong and/or brilliantly reproduced colors. As shown in Table 1, the overall color rendering index for a typical LED lamp may be about 73.0.

TABLE 2

CQS Values

| | | |
|---|---|---|
| VS1 | 76.0 | Purple |
| VS2 | 95.2 | Blue |
| VS3 | 71.3 | Cyan |
| VS4 | 61.9 | |
| VS5 | 67.3 | |
| VS6 | 68.4 | |
| VS7 | 69.7 | |
| VS8 | 77.4 | Green |
| VS9 | 94.3 | |
| VS10 | 82.0 | Yellow |
| VS11 | 74.7 | |
| VS12 | 73.3 | |
| VS13 | 74.4 | Orange |
| VS14 | 66.6 | Red |
| VS15 | 69.7 | |
| CQS | 73.1 | |

Similarly, Table 2 illustrates the color quality scale values VS1 through VS15 of seven test colors used to calculate an overall color quality scale (CQS) value according to the National Institute of Standards and Technology (NIST). As shown in Table 2, the general color quality scale value for a typical LED lamp may be about 73.1. Thus, LED lamps according to some embodiments of the present invention may enable higher color rendering performance under both the CRI and CQS performance standards.

Figure 4A:
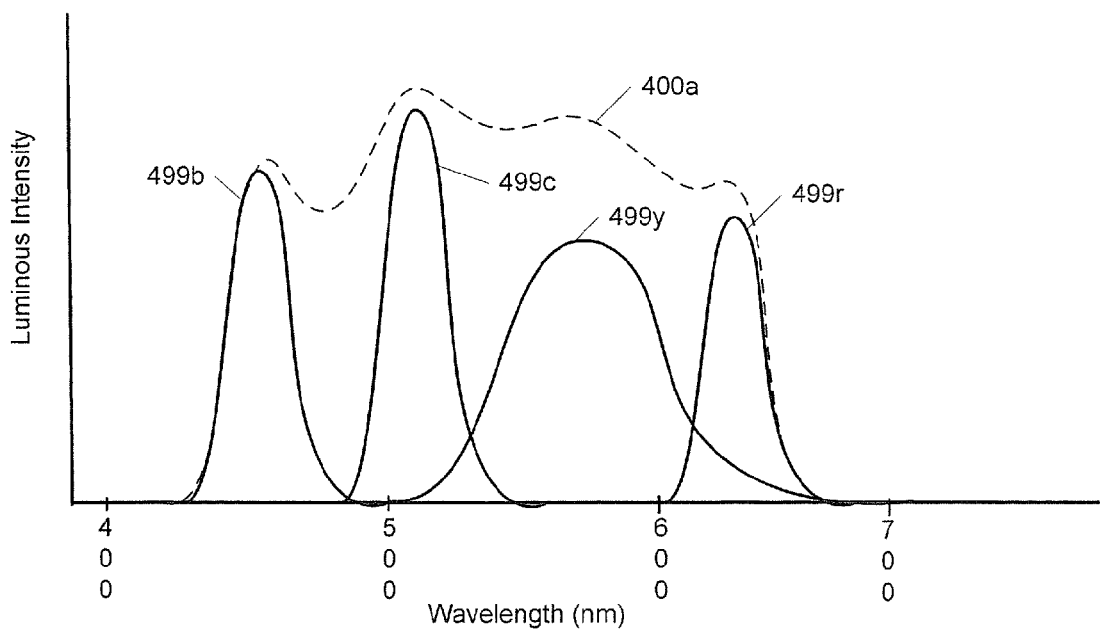
FIGS. 4A-4B are graphs illustrating the spectral distribution of light emitted by individual light emitting devices in light emitting device lamps according to some embodiments of the invention.

FIG. 4A is a graph illustrating an example of a spectral distribution of light that may be produced by an LED lamp according to some embodiments of the present invention, such as the LED lamp 300 of FIG. 3A. In FIG. 4A, the x-axis indicates the wavelength in nanometers (nm), while the y-axis indicates the luminous intensity. As shown in FIG. 4, the spectral distribution of the LED lamp 300 includes blue (B), cyan (C), and red (R) emission spectra 499b, 499c, and 499r, and emission spectrum 499y at a wavelength between cyan and red (e.g., yellow). The blue spectrum 499b represents the emission of the blue LED chip 303b, the cyan spectrum 499c represents the emission of the cyan LED chip 303c, and the red spectrum 499r represents the emission of the red LED chip 303r. The spectrum 499y represents the luminescence that is exhibited by a light conversion material, such as the yellow-emitting phosphor 306y, when photoexcited by the emission of the blue LED chip 303b.

The white light emitted by the LED lamp 300 can be characterized based on the peak wavelengths of the emission spectra 499b, 499c, 499r, and 499y of the respective blue, cyan, and red LED chips 303b, 303c, and 303r and the phosphor 306y. As illustrated in FIG. 4A, the blue LED chip 303b emits light having a peak wavelength of about 460 nm, while the red LED chip 303r emits light having a peak wavelength of about 610 nm, and the cyan LED chip 303c emits light having a peak wavelength of about 505 nm. The light conversion material emits light having a peak wavelength between the peak wavelengths of the cyan and red LED chips 303c and 303r. In addition, the luminous intensity of the emission spectra 499b, 499c, 499r, and 499y may be adjusted by independently applying particular drive currents to the respective blue, cyan, and red LED chips 303b, 303c, and 303r.

Accordingly, the combined spectral distribution of the LED lamp 300 includes the combination of the blue, cyan, and red emission spectra 499b, 499c, and 499r, and the emission spectrum 499y. More particularly, as shown by the dashed line 400a in FIG. 4A, the combination of the light emitted from the lamp 300 has local peak wavelengths at about 440-470 nm, 490-520 nm, 560-590 nm, and 610-630 nm. Also, in conventional LED lamps including red, blue, and green LED chips, the resultant white light may be uneven in color, as it may be difficult to diffuse and mix the respective colored emissions with outstanding monochromatic peaks in such a manner as to produce the desired white light. In contrast, the LED lamp 300 uses the luminescence exhibited by the phosphor 306y when photoexcited by the emission of the blue LED chip 303b to provide the intermediate spectrum 499y between the spectra 499c and 499r of the cyan and red LED chips 303c and 303r. As such, LED lamps according to some embodiments of the present invention may more evenly diffuse and/or mix the respective colors of light, for example, to provide warm white light having a relatively high CRI.

Figure 4B:
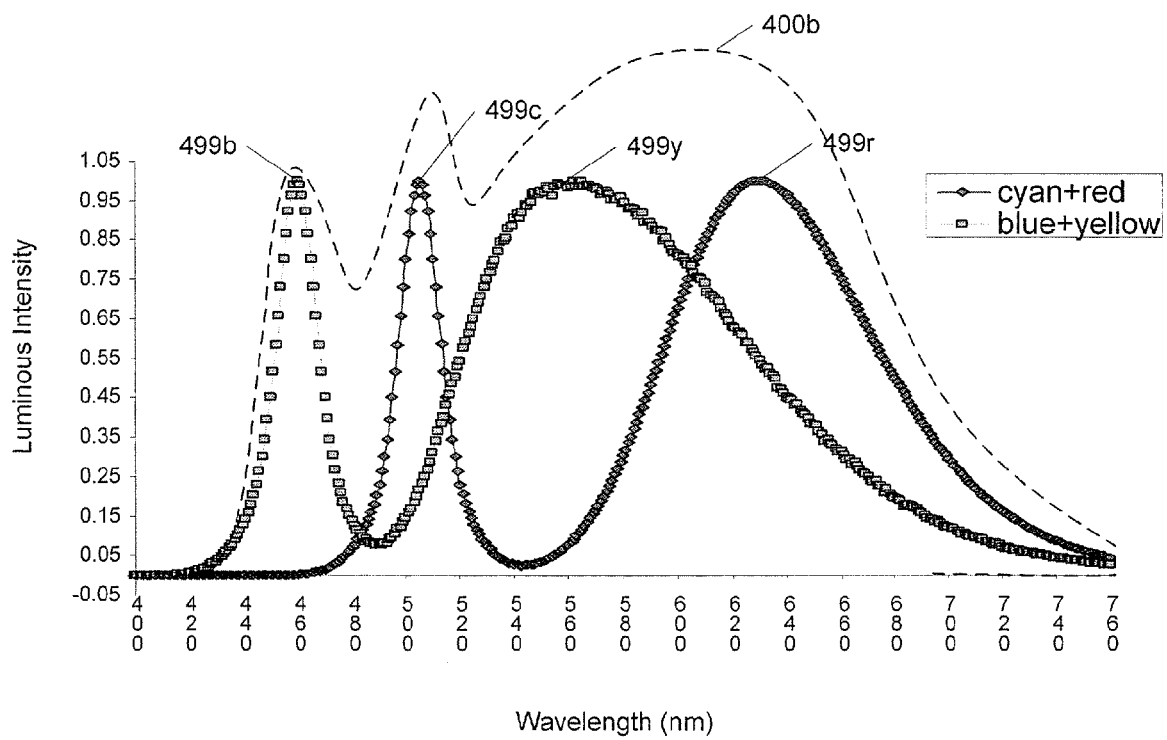

FIG. 4B is a graph illustrating an example of a spectral distribution of light that may be produced by an LED lamp according to some embodiments of the present invention, such as the LED lamp 325 of FIG. 3F. In FIG. 4B, the x-axis indicates the wavelength in nanometers (nm), while the y-axis indicates the luminous intensity. As shown in FIG. 4B, the spectral distribution of the LED lamp 325 includes blue (B), cyan (C), yellow (Y) and red (R) emission spectra 499b, 499c, 499y and 499r. The blue spectrum 499b represents the emission of the blue LED chips 303b and 303b', and the cyan spectrum 499c represents the emission of the cyan LED chips 303e and 303e'. The spectrum 499y represents the luminescence that is exhibited by a first light conversion material, such as the yellow-emitting phosphor 306y, when photoexcited by the emission of the blue LED chips 303b and/or 303b', while the spectrum 499r represents the luminescence that is exhibited by a second light conversion material, such as the red-emitting phosphor 306r, when photoexcited by the emission of the cyan LED chips 303c and/or 303e'

The white light emitted by the LED lamp 325 can be characterized based on the peak wavelengths of the emission spectra 499b, 499c, 499r, and 499y of the respective blue, cyan, and red LED chips 303b, 303c, and 303r and the phosphor 306y. As illustrated in FIG. 4B, the blue LED chips 303b and 303b' emit light in a wavelength range of about 445 nm to about 470 nm (with a peak wavelength of about 460 mm), while the cyan LED chips 303e and 303c' emit light in a wavelength range of about 495 mm to about 515 mm (with a peak wavelength of about 505 nm). The first and second light conversion materials emit light having respective peak wavelengths greater than that of the blue and cyan LED chips.

The combined spectral distribution of the LED lamp 325 includes the combination of the blue, cyan, yellow and red emission spectra 499b, 499c, 499y, and 499r, as shown by the dashed line 400b in FIG. 4B. As discussed above, the white light output from conventional LED lamps including red, blue, and/or green LED chips may be somewhat uneven in color, due to difficulties in diffusing and/or mixing the outstanding monochromatic peaks of the respective colored emissions. In contrast, the LED lamp 325 uses the luminescence exhibited by the phosphors 306y and 306r when respectively photoexcited by the emissions of the blue LED chips 303b and 303b' and the cyan LED chips 303c and 303c' to more evenly diffuse and/or mix the respective colors of light, and thus may provide warmer and relatively higher CRI white light. In addition, the luminous intensity of the emission spectra 499b, 499c, 499r, and 499y may be adjusted by independently applying particular drive currents to the blue LED chips 303b and 303b' and cyan LED chips 303c and 303c'.

Figure 5:
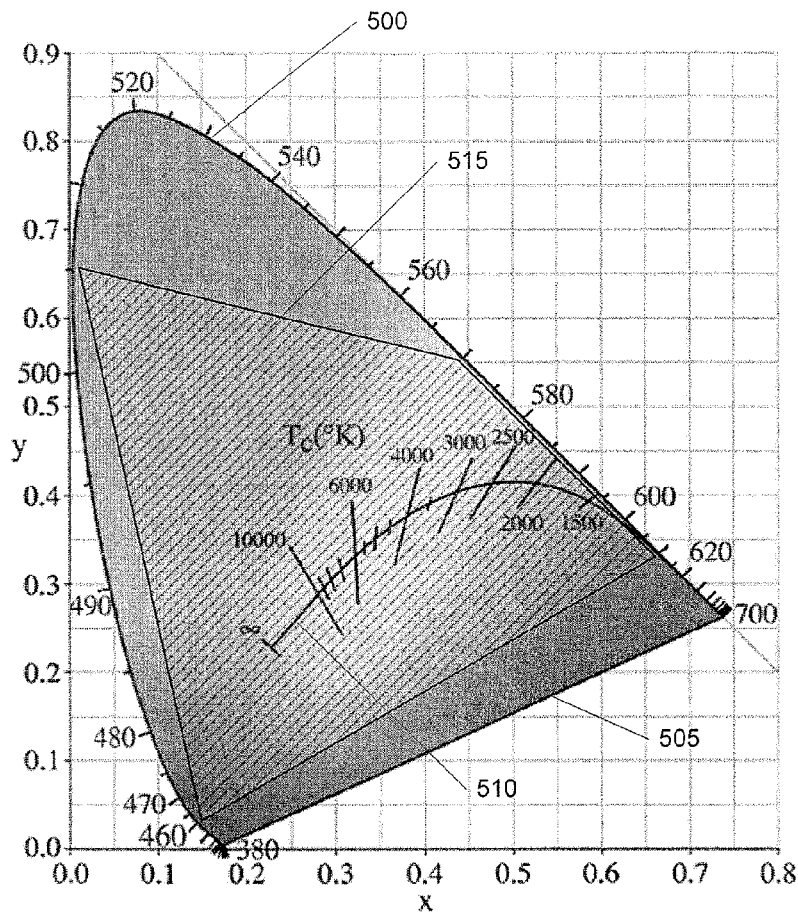
FIG. 5 is a chromaticity diagram illustrating the chromaticity of light emitted by light emitting device lamps according to some embodiments of the invention.

FIG. 5 is a chromaticity diagram illustrating an example of the chromaticity that may be provided by an LED lamp according to some embodiments of the present invention, such as the LED lamp 300 of FIG. 3A. In FIG. 5, the gamut of all visible chromaticities is illustrated as a horseshoe-shaped figure. More particularly, the curved edge 500 of the gamut is called the spectral locus, and corresponds to monochromatic light, with wavelengths listed in nanometers (nm). The straight edge 505 on the lower part of the gamut is called the purple line. These colors, although they are on the border of the gamut, have no counterpart in monochromatic light. Less saturated colors appear in the interior of the figure with white at the center. All colors that can be formed by mixing any two colors will lie on a straight line connecting two points that represent the two colors on the chromaticity diagram. In addition, all colors that can be formed by mixing three colors can be found inside the triangle formed by the corresponding points on the chromaticity diagram (and so on for multiple sources).

Accordingly, as shown in FIG. 5, the light emitted by the blue LED chip 303b has a peak wavelength of about 460 nm, the light emitted by the red LED chip 303r has a peak wavelength of about 610 nm, and the light emitted by the cyan LED chip 303c has a peak wavelength of about 505 nm. Also, the light emitted by the yellow-emitting phosphor 306y has a peak wavelength of about 570 nm. Accordingly, the LED lamp 300 may be configured to emit light having correlated color temperatures within the range defined by the shaded area 515. In other words, the white light produced by mixing the emissions of the blue, cyan, and red LED chips 303b, 303c, and 303r along with the yellow emitting phosphor 306y has a chromaticity falling within the range 515. As shown in FIG. 5, the range 515 is located over a blackbody radiation locus (i.e., Planckian locus) 510, and the chromaticity of the color-mixed light is not so different from the blackbody radiation locus 510 in a wide correlated color temperature range. In other words, the color of the light produced may have a variable chromaticity in a relatively wide correlated color temperature range. As a result, the general color rendering index of the lamp 300 can be increased. In particular, LED lamps according to some embodiments of the present invention may produce warm white light having a correlated color temperature of about 2600 K to about 6000 K with a relatively high CRI of greater than about 90, and in some embodiments, greater than about 95.

Figure 6:
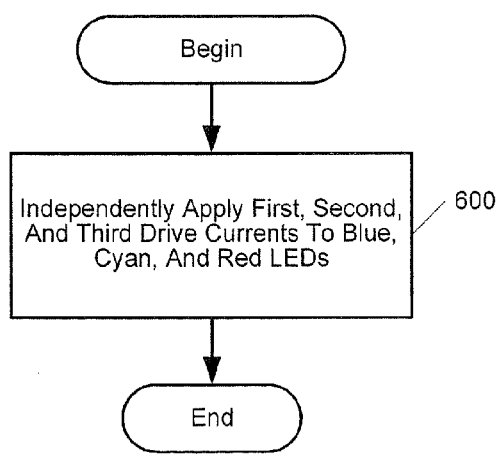
FIG. 6 is a flowchart illustrating methods for operating light emitting device lamps according to some embodiments of the invention.

In multi-chip LED lamps and light fixtures according to some embodiments of the present invention, the intensities of the individual LED chips may be independently controlled. This can be accomplished, for example, by controlling the relative emission of the LED chips through control of the applied current. FIG. 6 is a flowchart illustrating operations for controlling the relative intensities of LED chips in LED lamps according to some embodiments of the present invention, such as the LED lamp 300 of FIG. 3A, to provide high-CRI warm white light. More particularly, as shown in FIG. 6, first, second, and third drive currents are applied to the blue, cyan, and red LED chips at Block 600 at a ratio such that the combination of the light emitted from the blue, cyan, and red LED chips provides white light having a correlated color temperature of about 2600 K to about 6000 K and a CRI of about 90 to about 99. Accordingly, by controlling the relative power applied to the respective LED chips, a large range of flexibility may be available both for providing the desired chromaticity and controlling the color output of the individual devices. As such, LED light fixtures according to some embodiments of the invention may be provided that allow the end user to control the relative powers applied to the respective LED chips. In other words, the LED lamps of the fixture could be "tuned" by the user to achieve desired colors or hues from the lamps. This type of control can be provided by known control electronics, for example, using sets of predetermined current ratios.

In addition, although not illustrated, multi-chip LED lamps according to some embodiments of the present invention may also include lenses and facets to control the direction of the lamp's emitting light and mixing/uniformity. Other components, such as those related to thermal management, optical control, and/or electrical signal modification and/or control, may also be included to further adapt the lamps to a variety of applications.

Furthermore, phosphors according to some embodiments of the present invention may be provided by a semiconductor material, such as a direct bandgap semiconductor. More particularly, phosphors according to some embodiments of the present invention may include semiconductor materials having a narrower bandgap than that of the quantum wells of the LED chips. Such direct bandgap phosphors may be provided in the form of a film and/or a powder layer on an LED chip to provide a desired color shift. For example, such a direct bandgap phosphor may be an InGaN layer having a greater percentage of In than that found in the quantum wells of the LED chip. Other examples of direct bandgap semiconductors may include GaAs (1.42 eV), AlGaAs having an Al percentage of less than about 45%, and/or InP (1.34 eV). Moreover, indirect bandgap semiconductors may also be used as phosphors in some embodiments of the present invention, although such phosphors may provide reduced efficiency.

Figure 7A:
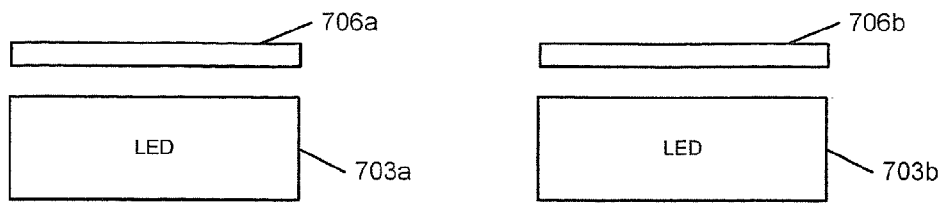
FIGS. 7A-7D are side views illustrating light emitting device lamps according to still further embodiments of the invention.
Figure 7B:
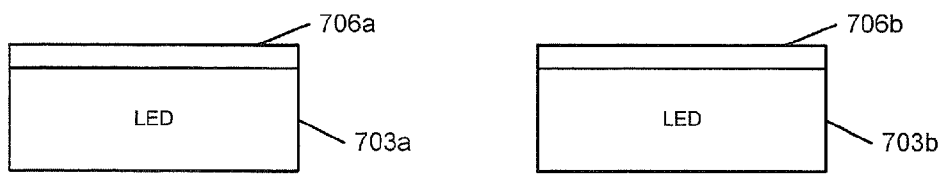
Figure 7C:
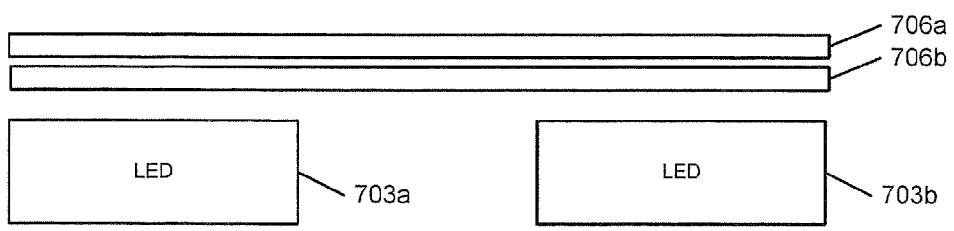
Figure 7D:
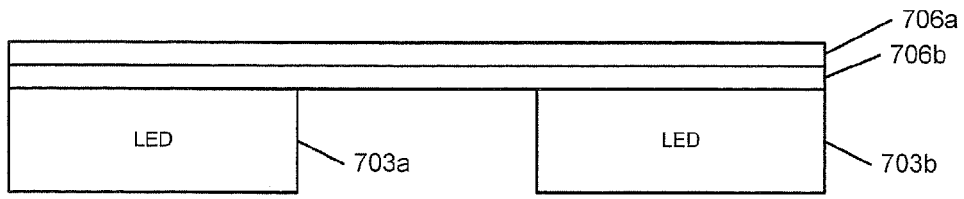

FIGS. 7A-7D illustrate example configurations of direct bandgap semiconductor phosphors in combination with LED chips according to some embodiments of the present invention. As shown in FIG. 7A, two direct bandgap semiconductor phosphors 706a and 706b (which may have different light absorption and/or emission characteristics) can be respectively provided on two LED chips 703a and 703b. For example, the direct bandgap semiconductor phosphors 706a and 706b may be formed on a substrate, such as a glass or sapphire substrate, and may thus be spatially separated from the two LED chips 703a and 703b by the substrate therebetween. In contrast, as shown in FIG. 7B, the phosphor 706a may be directly on the LED chip 703a, and the phosphor 706b may be directly on the LED chip 703b. Accordingly, as illustrated in FIGS. 7A and 7B, the LED chips 703a and 703b according to some embodiments of the present invention may include integrated wavelength conversion materials. Also, as shown in FIG. 7C, both of the direct bandgap semiconductor phosphor layers 706a and 706b may be stacked on the LED chips 703a and 703b and spatially separated therefrom by the substrate 705. As a further alternative, at least one of the stacked phosphor layers 706a and/or 706b may be directly on the LED chips 703a and 703b, as shown in FIG. 7D. Other configurations and/or combinations of direct bandgap semiconductor phosphors and LED chips may also be provided according to some embodiments of the present invention. For example, although illustrated above as completely covering the LED chips 703a and 703b, the phosphor layers 706a and/or 706b may be provided as partially overlapping one or more of the LED chips 703a and/or 703b such that not all of the light emitted therefrom is directed toward the phosphor layers 706a and/or 706b. Accordingly, in some embodiments, the phosphor layers 706a and/or 706b may be used as the phosphors in the light fixtures and/or lamps described above with reference to FIGS. 2A-3F.

The direct bandgap semiconductor phosphors 706a and 706b may be deposited on the LEDs 703a and/or 703b as thin films, for example, using Metal-Organic Chemical Vapor Deposition (MOCVD) and/or sputtering techniques. The films may be deposited on a substrate (such as sapphire or glass), on the inside of a lens, and/or directly on the LED chips. In addition, the direct bandgap semiconductor phosphors 706a and 706b may be grown on a substrate. The properties of the substrate upon which the film is grown and/or deposited, as well as the subsequent processing conditions, may be adjusted to provide the desired spectral output. A substrate including direct bandgap semiconductor phosphors according to some embodiments of the present invention may be used as a carrier wafer to support an LED, for example, where the substrate has been removed, and/or to support a semiconductor layer that has been separated from a substrate. Care may be taken so that the thin film layers are not damaged in subsequent processing. The phosphors 706a and 706b may also be provided in particle or powder form. For powder phosphors, the size and/or shape of the particles may also influence the desired spectral output.

Still referring to FIGS. 7A-7D, the size, stoichiometry, and/or morphology of the direct bandgap semiconductor phosphors 706a and 706b may be selected to provide a desired spectral output. For example, the stoichiometry of the phosphors 706a and 706b may be changed to alter the color of the emitted light and/or the absorption probability. More particularly, the probability of absorption of an incident photon may depend on the stoichiometry, which may affect the bandgap and/or density of states. For example, if the intrinsic energy level $E_i$ is greater than the bandgap $E_g$ of the phosphors 706a and 706b (for example, slightly greater than $E_g$), the density of states may be relatively small, and thus the probability of absorption may be relatively small. In contrast, if the intrinsic energy level $E_i$ is large compared to the bandgap $E_g$, the density of states may be greater, and absorption may be more likely. The probability of absorption may also be proportional to the thickness of the phosphor layers 706a and 706b.

Accordingly, the stoichiometry of the phosphors 706a and 706b may be adjusted to achieve a desired level of absorption and/or spectral output. For example, where the phosphors 706a and/or 706b are $In_xGa_{1-x}N$ layers, the value of x may be varied over the thickness of the phosphor layers 706a and/or 706b to provide a broader emission spectrum. In contrast, for a single (non-varying) composition, the spectral emission may be fairly narrow. The phosphor layers 706a and/or 706b may be configured to absorb at least a portion of the light emitted by the LED chips 703a and/or 703b and re-emit light at wavelengths greater than that of the light emitted by the LED chips 703a and/or 703b. Moreover, in some embodiments, the stoichiometry of the phosphors 706a and/or 706b may be adjusted to reduce the range of spectral emission. In other words, in some embodiments, the phosphors 706a and/or 706b may be configured to absorb and not re-emit light of particular wavelengths in some embodiments, for example, to reduce and/or remove undesired colors of light, although it may be at the expense of efficiency.

In some embodiments, the direct bandgap semiconductor phosphors 706a and 706b may include quantum well structures. As such, the stoichiometry of the absorption region may be altered to provide a desired probability of absorption, while the spectral output may be altered by quantum well structures. For example, the number of wells, well width, well separation, well shape, and/or well stoichiometry may be varied to improve color rendering and/or alter efficiency. In some embodiments, the region surrounding the quantum well may be tapered to guide and/or enhance diffusion into the well.

Figure 8:
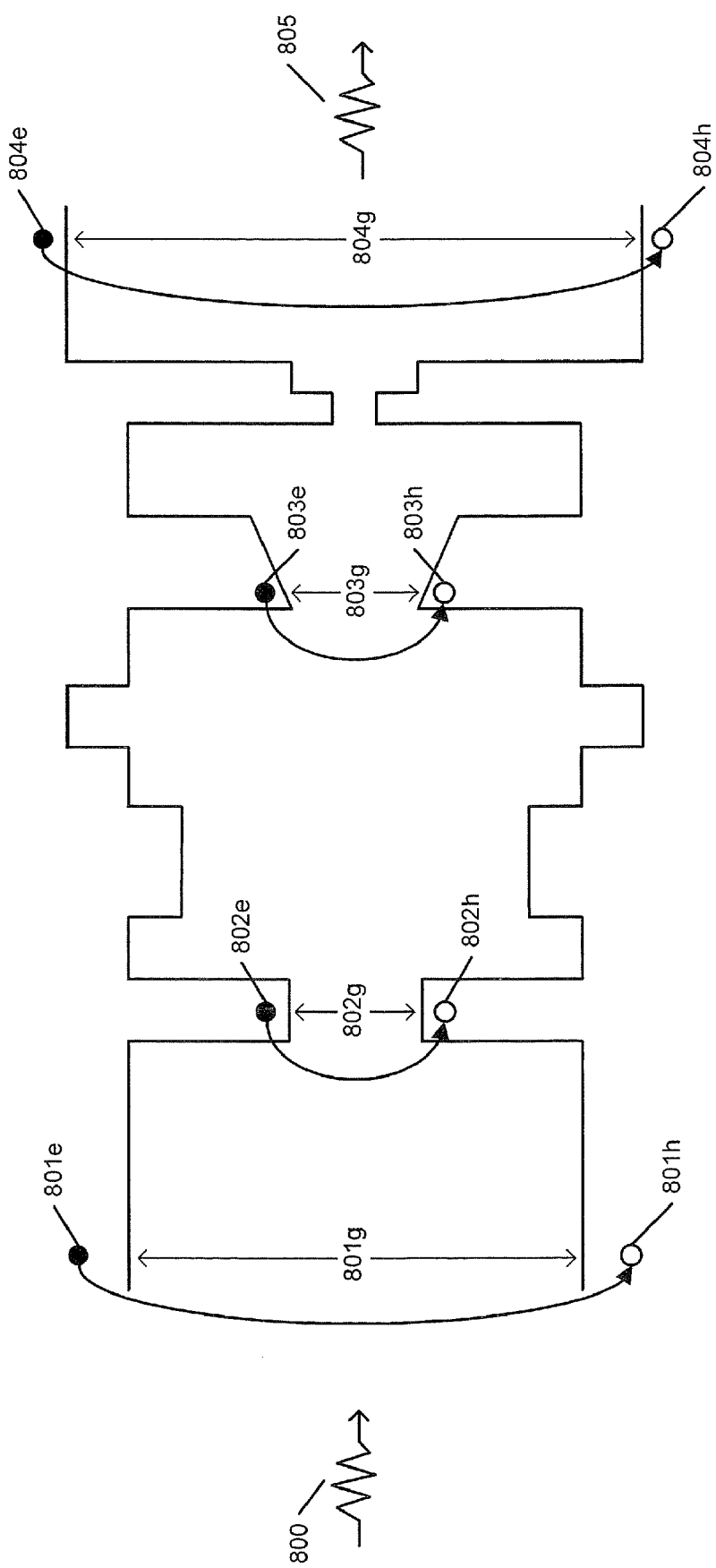
FIG. 8 is an energy diagram illustrating characteristics of direct bandgap semiconductor phosphor layers for use in light emitting device lamps according to still further embodiments of the invention.

FIG. 8 illustrates examples of different well shapes for quantum well structures that may be used in direct bandgap semiconductor phosphor layers according to some embodiments of the present invention. More particularly, FIG. 8 illustrates well structures having different well shapes, well widths, well depths, and/or well separation. The well structures may employ stepwise grading, continuous grading, and/or other techniques to provide a desired bandgap. As shown in FIG. 8, based on the incident light 800, electrons 801e-804e at the conduction-band can combine directly with holes 801h-804h at the valence band such that the energy of the recombination across the respective bandgaps 801g-804g may be emitted as output light 805. The number and/or shapes of the wells shown in FIG. 8 may be modified to achieve a desired spectral output for a given spectral input. For example, the quantum well width may be modified by adjusting the quantum well growth time, changing the growth temperature, and/or adjusting the partial pressures of the chamber gases. Also, the well stoichiometry may be adjusted by changing the gas partial pressures and/or other growth parameters. Changes such as these may be made during growth of the quantum well to produce a well with nonuniform shape (i.e., varying stoichiometry).

Direct bandgap semiconductor phosphors according to some embodiments of the present invention may also be doped to alter their optical and/or electrical properties. For example, dopants may be incorporated into the wells through the introduction of dopant source material into the growth chamber. In addition, direct bandgap semiconductor phosphors according to some embodiments of the present invention may be provided as conductors, for example, for electrical contacts.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A solid state lamp configured to emit light having spectral distribution including at least four different color peaks, the lamp comprising:
   a first solid state emitter adapted to emit light including a first color peak of said at least four different color peaks;
   a second solid state emitter adapted to emit light including a second color peak of said at least four different color peaks;
   a first conversion material at least partially covering the first solid state emitter but not covering the second solid state emitter, wherein the first conversion material is adapted to absorb light emitted by the first emitter and responsively re-emit light including a third color peak of said at least four different color peaks;
   a second conversion material at least partially covering each of the first solid state emitter and the second solid state emitter, wherein the second conversion material is adapted to absorb light emitted by any of the first emitter and the second emitter and responsively re-emit light including a fourth color peak of said at least four different color peaks.

2. The solid state lamp of claim 1, wherein the first conversion material only partially covers the first solid state emitter.

3. The solid state lamp of claim 1, wherein the second conversion material only partially covers at least one of the first solid state emitter and the second solid state emitter.

4. The solid state lamp of claim 1, further comprising a third solid state emitter adapted to emit light, wherein the second conversion material at least partially covers each of the first solid state emitter, second solid state emitter, and third solid state emitter.

5. The solid state lamp of claim 4, wherein the third solid state emitter is adapted to emit light including a color peak that is different from at least three of the at least four different color peaks.

6. The solid state lamp of claim 1, further comprising:
a third solid state emitter adapted to emit light including a fifth color peak that is different from any of said four different color peaks; and
a third conversion material at least partially covering the third solid state emitter but not covering the first or the second solid state emitters, wherein the third conversion material is adapted to absorb light emitted by the third emitter and responsively re-emit light including a color peak that is different from at least three of the at least four different color peaks;
wherein the second conversion material at least partially covers each of the first solid state emitter, second solid state emitter, and third solid state emitter.

7. The solid state lamp of claim 1, wherein each of the first and the second conversion material is non-contacting relative to the other.

8. The solid state lamp of claim 1, wherein any of the first and second conversion material comprises a phosphor.

9. The solid state lamp of claim 1, wherein any of the first and second conversion material comprises a semiconductor phosphor.

10. The solid state lamp of claim 1, wherein each of the first solid state emitter and the second solid state emitter is mounted to a common mounting element.

11. The solid state lamp of claim 1, having light output of at least about 60 lumens per watt with a color rendering index of at least 90.

12. The solid state lamp of claim 1, having light output of at least about 85 lumens per watt with a color rendering index of at least 90.

13. A light fixture comprising:
a first solid state lamp according to claim 1;
a second solid state lamp according to claim 1; and
a control circuit electrically coupled to the first and the second solid state lamps.

14. The light fixture of claim 13, wherein the control circuit is configured to independently apply drive current to each of the first solid state multi-chip emitter lamp and the second solid state multi-chip emitter lamp.

15. The light fixture of claim 14, wherein said control circuit is adapted to control intensity of light output from the light fixture.

16. The light fixture of claim 14, wherein said control circuit is adapted to control any of color and chromaticity of light output from the light fixture.

17. The light fixture of claim 13, wherein the control circuit is configured to independently apply drive current to first solid state emitter and each second solid state emitter.

18. The light fixture of claim 17, wherein the control circuit is adapted to provide independent pulse width modulation control for each emitter of the first solid state lamp and each emitter of the second solid state lamp.

19. The light fixture of claim 13, wherein the control circuit is adapted to adjust a ratio of drive currents to different solid state emitters to control any of intensity, color, and chromaticity of light output from the fixture.

20. The light fixture of claim 13, further comprising a solid state single-chip emitter lamp, wherein each of the first solid state emitter lamp, the second solid state emitter lamp, and the solid state single-chip emitter lamp is attached to a common mounting element.

21. The light fixture of claim 13, having light output of at least about 60 lumens per watt with a color rendering index of at least 90.

22. The light fixture of claim 13, having light output of at least about 85 lumens per watt with a color rendering index of at least 90.

23. The solid state lamp of claim 1, further comprising a control circuit arranged to independently energize and/or drive the first solid state emitter and the second solid state emitter.

24. The solid state lamp of claim 1, wherein at least one of the first conversion material and the second conversion material is spatially segregated from each of the first solid state emitter and the second solid state emitter.

25. A solid state lamp configured to emit light having spectral distribution including a plurality of different spectral peaks, the lamp comprising:
a first solid state emitter adapted to emit light having a first spectral peak;
a second solid state emitter adapted to emit light including a second spectral peak;
a first semiconductor phosphor arranged to receive light emissions from the first solid state emitter, wherein the first semiconductor phosphor is adapted to absorb at least a portion of said light emissions from the first solid state emitter and responsively re-emit light having a third spectral peak; and
a second semiconductor phosphor arranged to receive light emissions from the second solid state emitter, wherein the second semiconductor phosphor is adapted to absorb at least a portion of said light emissions from the second solid state emitter and responsively re-emit light having a fourth spectral peak;
wherein at least one of (a) the first spectral peak of the first solid state emitter and (b) the second spectral peak of the second solid state emitter, as well as said light emissions absorbed by at least one of the first semiconductor phosphor and the second semiconductor phosphor, is in a wavelength range of from about 440 nm to about 490 nm; and
wherein each of the first, second, third, and fourth spectral peak differs from the other.

26. The solid state lamp of claim 25, wherein each of the first spectral peak, second spectral peak, third spectral peak, and fourth spectral peak is in the visible range.

27. The solid state lamp of claim 25, wherein any of the first semiconductor phosphor and the second semiconductor phosphor comprises a direct bandgap semiconductor phosphor.

28. The solid state lamp of claim 25, wherein at least a portion of any of the first semiconductor phosphor and the second semiconductor phosphor comprises a conductive semiconductor serving as an electrical contact for the solid state lamp.

29. The solid state lamp of claim 25, wherein any of the first semiconductor phosphor and the second semiconductor phosphor comprises a quantum well structure.

30. The solid state lamp of claim 25, including at least one of the following features (a) and (b): (a) the first semiconductor phosphor is deposited on the first solid state emitter, and (b) the second semiconductor phosphor is deposited on the second solid state emitter.

31. The solid state lamp of claim 25, wherein any of the first semiconductor phosphor and the second semiconductor phosphor is deposited under a lens disposed over the first solid state emitter and the second solid state emitter.

32. The solid state lamp of claim 25, wherein any of the first semiconductor phosphor and the second semiconductor phosphor is deposited on a substrate supporting any of the first solid state emitter and the second solid state emitter.

33. The solid state lamp of claim 25, wherein any of the first semiconductor phosphor and the second semiconductor phosphor serves as a substrate to support any of the first solid state emitter and the second solid state emitter.

34. The solid state lamp of claim 25, wherein any of the first semiconductor phosphor and the second semiconductor phosphor partially overlaps any of the first solid state emitter and the second solid state emitter.

35. The solid state lamp of claim 25, further comprising a control circuit arranged to independently energize and/or drive the first solid state emitter and the second solid state emitter.

36. The solid state lamp of claim 25, wherein at least one of the first semiconductor phosphor and the second semiconductor phosphor is spatially segregated from each of the first solid state emitter and the second solid state emitter.

37. A light fixture comprising:
 a first solid state lamp according to claim 25;
 a second solid state lamp according to claim 25; and
 a control circuit electrically coupled to the first and the second solid state lamps.

* * * * *